US008249909B2

(12) United States Patent
Watanabe et al.

(10) Patent No.: US 8,249,909 B2
(45) Date of Patent: Aug. 21, 2012

(54) SYSTEM AND METHOD FOR VISUALIZING THE CONSTRUCTION PROGRESS OF SCAFFOLDING UTILIZING 3D CAD MODELS

(75) Inventors: Norito Watanabe, Hitachi (JP); Kenji Araki, Mito (JP); Toshiyuki Miyake, Hitachi (JP)

(73) Assignee: Hitachi-GE Nuclear Energy, Ltd., Ibaraki (JP)

( * ) Notice: Subject to any disclaimer, the term of this patent is extended or adjusted under 35 U.S.C. 154(b) by 374 days.

(21) Appl. No.: 12/607,543

(22) Filed: Oct. 28, 2009

(65) Prior Publication Data

US 2010/0114635 A1   May 6, 2010

(30) Foreign Application Priority Data

Oct. 31, 2008  (JP) ................................. 2008-280670

(51) Int. Cl.
    G06Q 10/00  (2012.01)
(52) U.S. Cl. ...................... 705/7.23; 705/7.15
(58) Field of Classification Search ................. 705/7.23, 705/7.15
    See application file for complete search history.

(56) References Cited

U.S. PATENT DOCUMENTS

| | | | | |
|---|---|---|---|---|
| 4,700,318 A | * | 10/1987 | Ockman | 345/595 |
| 4,875,162 A | * | 10/1989 | Ferriter et al. | 705/29 |
| 5,189,606 A | * | 2/1993 | Burns et al. | 705/7.23 |
| 5,381,332 A | * | 1/1995 | Wood | 705/7.25 |
| 5,974,391 A | * | 10/1999 | Hongawa | 705/7.26 |
| 5,991,769 A | * | 11/1999 | Fino et al. | 345/619 |
| 6,037,945 A | * | 3/2000 | Loveland | 345/420 |
| 6,038,547 A | * | 3/2000 | Casto | 705/30 |
| 6,446,053 B1 | * | 9/2002 | Elliott | 705/400 |
| 6,593,938 B1 | * | 7/2003 | Sakata et al. | 345/629 |
| 6,859,768 B1 | * | 2/2005 | Wakelam et al. | 703/1 |
| 7,031,930 B2 | * | 4/2006 | Freeman et al. | 705/7.13 |
| 7,042,468 B2 | * | 5/2006 | Schwegler et al. | 345/629 |
| 7,318,039 B2 | * | 1/2008 | Yokota et al. | 705/7.17 |
| 7,437,335 B2 | * | 10/2008 | Baum | 706/12 |
| 7,720,703 B1 | * | 5/2010 | Broughton | 705/7.23 |
| 7,904,324 B2 | * | 3/2011 | Gura | 705/7.13 |
| 8,041,650 B2 | * | 10/2011 | Gaffey et al. | 705/342 |
| 8,155,928 B2 | * | 4/2012 | Nonaka et al. | 703/1 |

(Continued)

FOREIGN PATENT DOCUMENTS

JP       3-291763 A       12/1991

(Continued)

OTHER PUBLICATIONS

Huang, Ting et al., A virtual prototyping system for simulationg construction process Automation in Construction, vol. 16, 2007.*

(Continued)

*Primary Examiner* — Scott L Jarrett
(74) *Attorney, Agent, or Firm* — Mattingly & Malur, PC

(57) ABSTRACT

A construction progress visualization system, having a scaffolding model creating-unit for creating an area and a form of scaffolding required for a construction operation based on a 3D CAD model and a construction schedule data; a scaffolding schedule extracting-unit for extracting scaffolding schedule data regarding the scaffolding from the construction schedule data; a scaffolding display form determining-unit for determining a completion rate of the scaffolding on a visualization-target date based on a relationship between the visualization-target date and the scaffolding schedule data, and obtaining a display form of the scaffolding; and a display process unit for displaying, concurrently with the CAD model, the scaffolding area based on the obtained display form of the scaffolding.

15 Claims, 21 Drawing Sheets

U.S. PATENT DOCUMENTS

| | | | |
|---|---|---|---|
| 2002/0087381 A1* | 7/2002 | Freeman et al. | 705/9 |
| 2003/0050871 A1* | 3/2003 | Broughton | 705/28 |
| 2004/0117361 A1* | 6/2004 | Greer et al. | 707/3 |
| 2004/0205519 A1* | 10/2004 | Chapel et al. | 715/502 |
| 2004/0236711 A1* | 11/2004 | Nixon et al. | 707/1 |
| 2005/0080502 A1* | 4/2005 | Chernyak et al. | 700/97 |
| 2006/0044307 A1* | 3/2006 | Song | 345/419 |
| 2006/0074609 A1* | 4/2006 | Freeman et al. | 703/1 |
| 2008/0255914 A1* | 10/2008 | Oren | 705/8 |
| 2009/0125352 A1 | 5/2009 | Miyake et al. | |
| 2009/0299811 A1* | 12/2009 | Verfuerth et al. | 705/9 |

FOREIGN PATENT DOCUMENTS

| | | | |
|---|---|---|---|
| JP | 8-63513 A | 3/1996 | |
| JP | 9-268760 A | 10/1997 | |
| JP | 10-8706 A | 1/1998 | |
| JP | 2000-48061 A | 2/2000 | |
| JP | 2000-110350 A | 4/2000 | |
| JP | 2001-142926 A | 5/2001 | |
| JP | 2002-266498 A | 9/2002 | |
| JP | 3524389 B2 | 2/2004 | |
| JP | 3564749 B2 | 6/2004 | |
| JP | 2006-24073 A | 1/2006 | |
| JP | 2009-116806 A | 5/2009 | |

OTHER PUBLICATIONS

Fischer, Martin et al., Scheduling with Computer-Interpretable Construction Method Models CIFE Working Paper, No. 41, Stanford University, Jun. 1995.*

Fischer, Martin, 4D Modeling: Application and Benefits CIFE, Common Point Technologies, Inc., 2005.*

McKinney, Kathleen et al., Generating, evaluating and visualizing construction schedules with CAD tools Automation in Construction, vol. 7, 1998.*

Chau, K.W et al., 4D dynamic construction management and visualization software: 1. Development Automation in Construction, vol. 14, 2005.*

Tulke, Jan et al., 4D Construction Sequence Planning—New Process and Data Model Proceedings of CIB-W78 24 th International Conference on Information Technology in Construction, 2007.*

Regolj, Danijel et al., Automated Construction Activity Monitoring System Advanced Engineering Infomatics, vol. 22, 2008.*

Dharwadkar, Parmanand V. et al., Project Management Using Intelligent 3-D CAD Transactions of AACE International, 1994.*

Cohn, Keep It Inside AutoCAD: Data Extraction Direct to AutoCAD Tables Autodes University, 2008.*

Hendrickson, Chris, Project Management for Construction Prentice Hal, Version 2.2, Summer 2008.*

Cadsglobal.com Web Pages—SMART Scaffolding Software CadsGlobal.com, Dec. 24, 2008, Retrieved from Archive.org Jan. 11, 2012.*

Scia Scaffolding White Paper: Providing an accurate design and time-saving workflow Scia, 2009.*

Assakkaf, Ibrahim Dr., Project Scheduling 2006.*

Guo, Sy-Jye, Identification and Resolution of Work Space Conflicts in Building Construction Journal of Construction Engineering and Management, Jul./Aug. 2002.*

Avontus.com Web Pages—CAD for Falsework Avontus.com, Feb. 26, 2009, Retrieved from Archive.org Jan. 11, 2012.*

Scaffolding.co.nz Web pages—PSCaff 200 Scaffolding Software Scaffolding.co.nz, Sep. 2007, Retrieved from Archive.org Jan. 11, 2012.*

Koo, Bonsang et al., Feasbility Study of 4D CAD in Commercial Construction Center for Integrated Facility Engineering, CIFE Technical Report No. 118, Aug. 1998.*

* cited by examiner

FIG. 2

| UID | EQUIPMENT TYPE | EQUIPMENT ID | AREA NO. | LAYOUT POSITION | PLACEMENT ROTATION |
|---|---|---|---|---|---|
| 1 | EQUIPMENT | EQ1 | F1-23 | 100, 100, 10 | 0, 0, 0 |
| 2 | LARGE BORE PIPING | LP1 | F1-23 | 20, 10, 18 | 0, 0, 0 |
| 3 | LARGE BORE PIPING | LP2 | F1-23 | 20, 10, 15 | 0, 0, 0 |
| 4 | BUILDING FRAME | CV1 | F1-23 | 100, 100, 0 | 0, 0, 0 |
|  |  |  |  |  |  |

FIG. 3

| EID | UID | BASIC GRAPHIC SHAPE TYPE | LAYOUT POSITION | PLACEMENT ROTATION | MAGNIFICATION FACTOR | BASIC GRAPHIC SHAPE SIZE |
|---|---|---|---|---|---|---|
| 1 | 1 | CUBE |  |  |  |  |
| 2 | 1 | CUBE |  |  |  |  |
| 3 | 2 | CYLINDER |  |  |  |  |
| 4 | 2 | TORUS |  |  |  |  |
| 5 | 3 | CYLINDER |  |  |  |  |
| 6 | 3 | CONE |  |  |  |  |
| 7 | 4 | CUBE |  |  |  |  |
| 8 | 4 | CUBE |  |  |  |  |
|  |  |  |  |  |  |  |

TYPE 401

- EQUIPMENT
- MODULE
- LARGE BORE PIPING
- SMALL BORE PIPING
- LARGE BORE SUPPORT
- SMALL BORE SUPPORT

FIG. 6

| BASIC GRAPHIC SHAPE TYPE | SHAPE | SIZE |
|---|---|---|
| CUBE | | #1: WIDTH (W)<br>#2: DEPTH (D)<br>#3: HEIGHT (H) |
| CYLINDER | | #1: RADIUS (r)<br>#2: HEIGHT (H) |
| CONE | | #1: BOTTOM RADIUS (r)<br>#2: HEIGHT (H) |
| TORUS | | #1: RADIUS (r1)<br>#2: RADIUS (r2) |
| SPHERE | | #1: RADIUS (r) |

FIG. 7

| AID | AREA NO. | WORK DIVISION | OPERATION ITEM | OBJECT | OPERATION NAME | STARTING DATE | ENDING DATE |
|---|---|---|---|---|---|---|---|
| 1 | F1-23 | COMMON WORK | SCAFFOLDING | | ASSEMBLY AND CARRYING IN OF SCAFFOLDING FOR PRE-CARRYING-IN | 2008/1/9 | 2008/1/10 |
| 2 | F1-23 | COMMON WORK | SCAFFOLDING | | DEMOLITION OF SCAFFOLDING FOR PRE-CARRYING-IN | 2008/2/25 | 2008/2/27 |
| 3 | F1-23 | COMMON WORK | SCAFFOLDING | | ASSEMBLY OF SCAFFOLDING FOR COMMON USE | 2008/3/2 | 2008/3/10 |
| 4 | F1-23 | COMMON WORK | SCAFFOLDING | | REASSEMBLY OF SCAFFOLDING FOR COMMON USE | 2008/4/10 | 2008/4/15 |
| 5 | F1-23 | COMMON WORK | SCAFFOLDING | | DEMOLITION OF SCAFFOLDING FOR COMMON USE | 2008/6/1 | 2008/6/5 |
| 6 | F1-23 | MACHINE WORK | EQUIPMENT 1 | EQ1 | ANCHOR BOLT SETTING | 2008/2/9 | 2008/2/15 |
| 7 | F1-23 | MACHINE WORK | EQUIPMENT 1 | EQ1 | CARRYING IN | 2008/2/19 | 2008/2/20 |
| 8 | F1-23 | MACHINE WORK | EQUIPMENT 1 | EQ1 | HEAT RETAINING | 2008/5/6 | 2008/5/10 |
| 9 | F1-23 | MACHINE WORK | PIPING 1 | LP1 | HANGING | 2008/3/15 | 2008/3/20 |
| 10 | F1-23 | MACHINE WORK | PIPING 1 | LP1 | FIT UP | 2008/3/26 | 2008/3/31 |
| 11 | F1-23 | MACHINE WORK | PIPING 1 | LP1 | WELDING | 2008/4/20 | 2008/4/25 |
| 12 | F1-23 | MACHINE WORK | PIPING 2 | LP2 | HANGING | 2008/3/22 | 2008/3/25 |
| 13 | F1-23 | MACHINE WORK | PIPING 2 | LP2 | FIT UP | 2008/4/1 | 2008/4/5 |
| 14 | F1-23 | MACHINE WORK | PIPING 2 | LP2 | WELDING | 2008/4/26 | 2008/4/30 |

FIG. 11

| UID | AID |
|---|---|
| 1 | 6 |
| 1 | 7 |
| 1 | 8 |
| 2 | 9 |
| 2 | 10 |
| 2 | 11 |
| 3 | 12 |
| 3 | 13 |
| 3 | 14 |
| | |

| AID | UID | BASIC GRAPHIC SHAPE TYPE | LAYOUT POSITION | PLACEMENT ROTATION | MAGNIFI- CATION FACTOR | BASIC GRAPHIC SHAPE SIZE | OPERATION NAME | COMPLE- TION RATE |
|---|---|---|---|---|---|---|---|---|
| 1 | 1 | CUBE | | | | | CARRYING IN (AID=7) | 50% |
| 2 | 1 | CUBE | | | | | CARRYING IN (AID=7) | 50% |
| 3 | 4 | CUBE | | | | | – | – |
| 3 | 4 | CUBE | | | | | – | – |

| OPERATION NAME | COLOR |
|---|---|
| ANCHOR BOLT SETTING | RED |
| CARRYING IN | BLUE |
| HEAT RETAINING | GREEN |
| HANGING | CYAN |
| FIT UP | MAGENTA |
| WELDING | YELLOW |

~1103

2201

2202

2203

SYSTEM AND METHOD FOR VISUALIZING THE CONSTRUCTION PROGRESS OF SCAFFOLDING UTILIZING 3D CAD MODELS

CLAIM OF PRIORITY

The present application claims priority from Japanese Patent Application Serial No. 2008-280670, filed on Oct. 31, 2008, the content of which is hereby incorporated by reference into this application.

BACKGROUND OF THE INVENTION

The present invention relates to a construction progress visualization system and a method of visualizing construction progress for visualizing statuses of construction operations and installation operations, operations such as those for plant facilities or building facilities that require scaffolding. More particularly, the invention relates to a technology that allows checking a construction schedule involving complex structures and procedures by using 3D models, and allows overseeing the progress of the construction schedule.

Conventional methods for visualizing construction schedules and progress include systems and tools called 4D simulation. In this method, a 3D model of a construction object is associated with the construction schedule data, and the schedule is animated in such a way that the 3D model is sequentially displayed as the construction schedule progresses.

Things to check here are procedures of operations and interference between the operations. In a conventional method, an installation-object model in the installation process is displayed in animation, or visibility (transparency) is controlled for different display effects. Generally, when operations involve no movement of the model, such as welding or inspection operations, the operations are expressed in a different display color for the object model.

For visualizing operation interference, the technique shown in Japanese Patent No. 3564749 has been devised. In this method, human models corresponding to workers are displayed simultaneously with installation-object models, and operations are evaluated based on the traffic of the human models.

On the other hand, in construction, the amount of material, assembly operation, and demolition operation of a temporary structure such as scaffolding required for the construction must be considered in addition to installation objects. As methods of designing scaffolding, those shown in Japanese Patent Laid-open No. Hei 10 (1998)-8706 and Japanese Patent No. 3524389 are known. In these methods, the most suitable scaffolding arrangement can be designed for construction operation.

SUMMARY OF THE INVENTION

Although the conventional technique known as 4D simulation allows checking of construction procedures and flows, it cannot display operation progress with regard to temporary structures such as scaffolding that are not modeled in a CAD system.

Conventional examples for designing optimal scaffolding are available; however, when installation details are handed to a subcontractor, there is no need to design scaffolding in detail. As a client, only the overall amount of material, operation flows, and operation progress are of interest, thus designing optimal scaffolding or modeling detailed scaffolding would be a wasteful operation.

The method which displays human models to check the operation interference, as in the conventional example, is fine when workers stay in one place to operate; however, in this method, it is difficult to find the interference when the operators have an operation area, i.e., the operators move as they operate.

An object of the present invention is to provide a construction progress visualization system and a method of visualizing construction progress enabling checking of the flow of construction operation including the installation of scaffolding, which is a temporary structure not in CAD models, interference between operations in the construction operation, and operation progress in the construction operation.

A feature of the present invention for achieving the above object is a construction progress visualization system comprising:

a CAD model storage unit for storing a 3D CAD model of a construction object;

a construction schedule storage unit for storing construction schedule data;

a scaffolding model creating unit for creating an area and a form of scaffolding required for a construction operation based on the 3D CAD model and the construction schedule data, a scaffolding schedule extracting unit for extracting schedule data regarding the scaffolding from the construction schedule data in the construction schedule storage unit;

a scaffolding display form determining unit for determining a completion rate of the scaffolding on a visualization-target date based on a relationship between the visualization-target date and the scaffolding schedule data, and obtaining a display form of the scaffolding; and a display process unit for generating display information of the CAD model, and display information of the scaffolding area based on the obtained display form of the scaffolding.

According to the present invention, the overall amount of material and the construction progress of a temporary structure such as scaffolding can be grasped in a 3D space from the CAD model of the construction object and the construction schedule.

BRIEF DESCRIPTION OF THE DRAWINGS

FIG. 2 is an explanatory drawing showing an example of an installation object table.

FIG. 3 is an explanatory drawing showing an example of a graphic shape element table.

FIG. 6 is an explanatory drawing showing examples of types and definitions of basic graphic shapes.

FIG. 7 is an explanatory drawing showing an example of a construction schedule table.

FIG. 11 is an explanatory drawing showing an example of a CAD-schedule mapping table.

FIG. 12 is an explanatory drawing showing an example of a display graphic shape element table.

DETAILED DESCRIPTION OF THE PREFERRED EMBODIMENTS

Various embodiments of the present invention are described. However, the invention is not limited to these.

Embodiment 1

Figure 1:
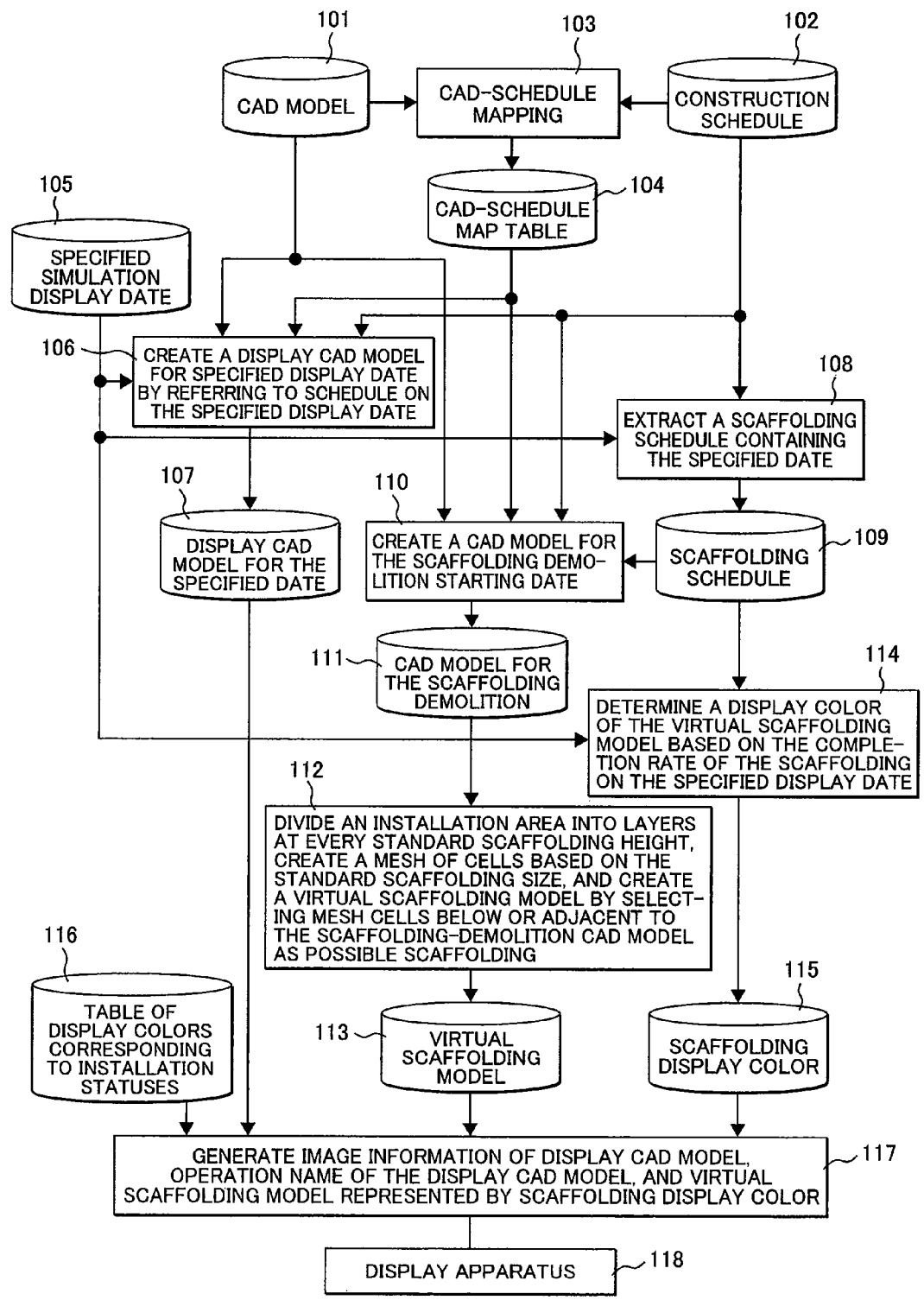
FIG. 1 is a structural diagram showing a construction progress visualization system according to a preferred embodiment of the present invention.

FIG. 1 is a structural diagram showing a construction progress visualization system according to a preferred embodiment of the present invention. The construction progress visualization system of the present embodiment will be described below by referring FIG. 1.

A CAD model of a construction object is stored in a CAD model storage unit 101. Construction schedule data are stored in a construction schedule storage unit 102. A CAD-schedule mapping process unit 103 seeks for corresponding relationships between the CAD model and the construction schedule data, and stores tables of each sought relationship in a CAD-schedule map table storage unit 104. Executing the process by the CAD-schedule mapping process unit 103 and storing the table in the CAD-schedule map table storage unit 104 can be done before simulation as a preprocessing of the simulation.

A user of the construction progress visualization system specifies a date for which the user wants to display the simulation. The specified display date is stored in a simulation display date storage unit 105. Then the construction progress visualization system displays a simulation image by sequentially executing each process of a display CAD model creating unit 106, a scaffolding schedule extracting unit 108, a scaffolding-demolition CAD model creating unit 110, a virtual scaffolding creating unit 112, a scaffolding display color determining unit 114, and a display process unit 117.

An overview of the entire process is described below. Details of data and logic in each unit are described later.

First of all, in order to display a CAD model of a construction object, the display CAD model creating unit 106 extracts the CAD model including equipment and scaffoldings and the installation status on the specified display date by referring to data in the simulation display date storage unit 105, the CAD model storage unit 101, the CAD-schedule map table storage unit 104, and the construction schedule storage unit 102, and stores the extracted CAD model and installation status in a display CAD model storage unit 107.

Now, in order to create a scaffolding display model, the scaffolding schedule extracting unit 108 extracts scaffolding schedule data containing the specified display date in the simulation display date storage unit 105 from the construction schedule storage unit 102, and stores the extracted scaffolding schedule data in a scaffolding schedule storage unit 109. Then, the scaffolding-demolition CAD model creating unit 110 retrieves the scaffolding-demolition starting date from the scaffolding schedule storage unit 109, and obtains a scaffolding-demolition CAD model of the construction object on that day by referring to the CAD model storage unit 101, the CAD-schedule map table storage unit 104, and the construction schedule storage unit 102. That is, this scaffolding-demolition CAD model can be obtained by retrieving the construction schedule data on that day from the construction schedule storage unit 102, retrieving an ID of the CAD data mapped in the retrieved construction schedule data from the CAD-schedule map table storage unit 104, and retrieving the CAD data corresponding to the retrieved ID of the CAD data from the CAD model storage unit 101. The obtained scaffolding-demolition CAD model is stored in a scaffolding-demolition CAD model storage unit 111. A virtual scaffolding creating unit 112 creates a scaffolding area required for the construction of the scaffolding-demolition CAD model based on the stored scaffolding-demolition CAD model, and stores the data of the scaffolding area in a virtual scaffolding model storage unit 113 as a virtual scaffolding model.

In order to obtain a display color of the virtual scaffolding model stored in the virtual scaffolding model storage unit 113, the scaffolding display color determining unit 114 calculates a completion rate of the scaffolding based on a relationship between the specified simulation display date and the scaffolding schedule in the scaffolding schedule storage unit 109, determines the display color of the scaffolding corresponding to the completion rate, and stores it in a scaffolding display color storage unit 115.

The display process unit 117 retrieves information on the CAD model and its installation status on the specified display date from the display CAD model storage unit 107, and information on an operation display color corresponding to the operation status of each CAD model from an operation display color table storage unit 116. The display process unit 117 generates image information (display information) for displaying on a display apparatus 118, including those retrieved information. In addition, the display process unit 117 retrieves the virtual scaffolding model corresponding to the retrieved CAD model from the virtual scaffolding model storage unit 113, and the scaffolding display color corresponding to the retrieved virtual scaffolding model from the scaffolding display color storage unit 115. The display process unit 117 generates image information for displaying on the display apparatus 118, including the retrieved virtual scaffolding model represented based on the retrieved scaffolding display color. The display process unit 117 outputs the generated image information to the display apparatus 118.

By these processes, the CAD model in the construction status on the specified display date specified by the user and the scaffolding in the construction status assumed from the CAD model can be combined in 3D and displayed.

FIGS. 2 and 3 show some data stored in the CAD model storage unit 101. An installation object table 201 is described in FIG. 2. This table includes information for every installation unit (equipment, piping, etc.). The information stored in this table includes a UID (Unit ID) for identifying the installation object, an equipment type of the installation object, an equipment ID for identifying the installation object for every equipment type, an area no. showing the operation area for installation, a layout position showing the installation position, and a placement rotation, for every installation object.

Figure 4:
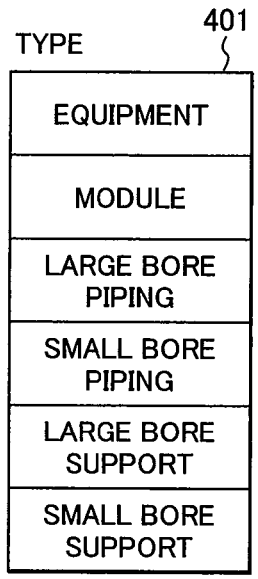
FIG. 4 is an explanatory drawing showing examples of equipment types.

The equipment type information is retrieved from an equipment type table 401 as shown in FIG. 4, and a relevant piece of data is stored in the corresponding field of the installation object table 201. The equipment types, to be more specific, are an equipment, a module, a large bore piping, a small bore piping, a large bore support, a small bore support, a duct, a tray, a building frame, and so on.

FIG. 3 shows a graphic shape element table 301 including graphic shape elements that are necessary for display. This table includes graphic shape elements for displaying each installation unit in the installation object table 201. The data stored this table 301 include an EID (Element ID) for identifying the element, a UID showing the installation object, a basic graphic shape type, a layout position of the basic graphic shape, a placement rotation, a magnification rate, and a size of the basic graphic shape.

For the basic graphic shapes, those shown in FIG. 6 are prepared.

Figure 5:
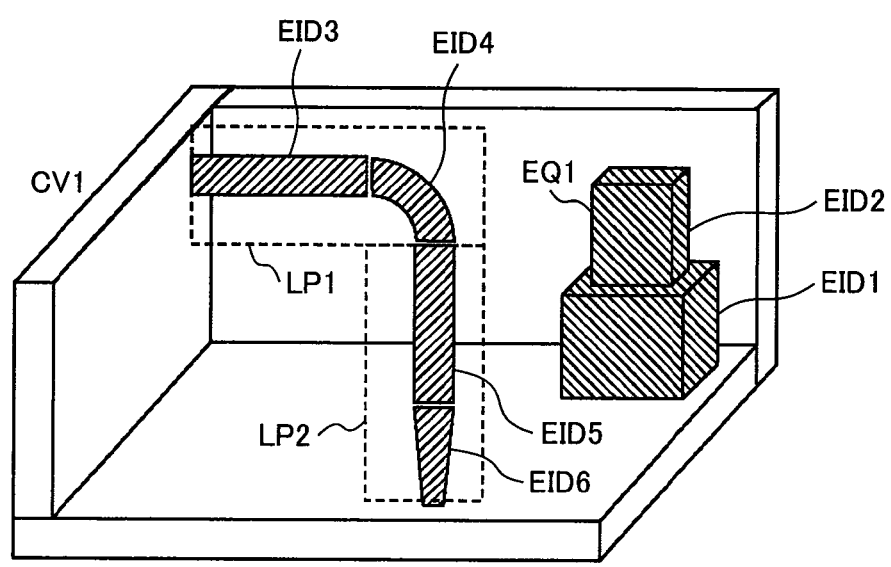
FIG. 5 is an explanatory drawing showing an example of construction CAD models.

The example shown in FIG. 3 represents models shown in FIG. 5. In FIG. 5, a building frame CV1 houses an equipment EQ1 (UID1) made up of two cubes, EID1 and EID2, a large bore piping LP1 (UID2) made up of a cylinder EID3 and a (part of a) torus EID4, a large bore piping LP2 (UID3) made up of a cylinder EID5 and a (part of a) cone EID6, and a building frame (UID4) made up of cubes, EID7 and EID8, etc., are defined. The models are simplified and details of the layout position are omitted here.

Figure 8:
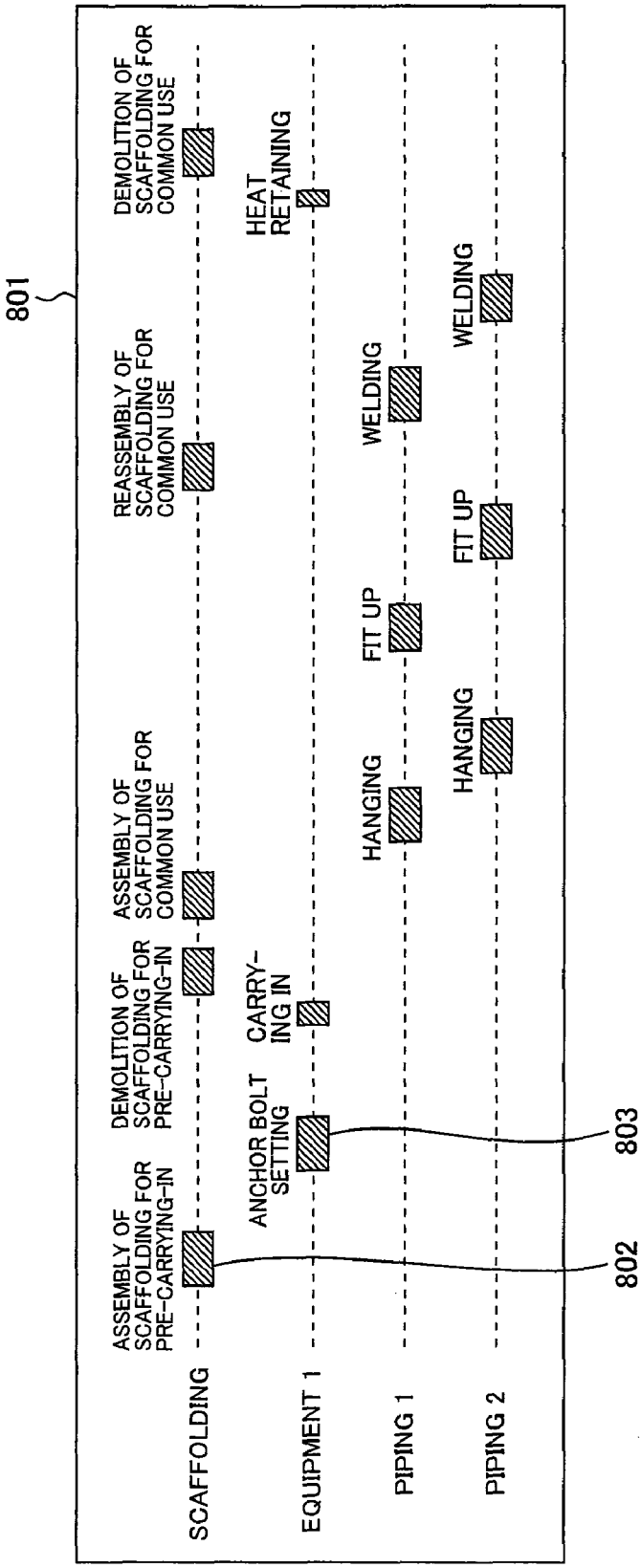
FIG. 8 is an explanatory drawing showing an example of a displayed Gantt chart of the construction schedule.

FIG. 7 shows a construction schedule table 701 stored in the construction schedule storage unit 102. The construction schedule table 701 includes an AID (Activity ID) for identifying each construction operation (activity), an area no. showing the operation area for the construction operation, a work division showing the division of the operation, an operation item name showing the operation object, object information for identifying the specific operation object, an operation name showing each individual operation, and starting/ending dates showing the starting/ending dates of the operation. In the object information field, an ID (UID) for identifying the CAD model is stored. However, a model that cannot create the scaffolding in CAD is not stored in the object information field. This construction schedule table 701 is represented in a Gantt chart example in FIG. 8. In a schedule table 801, the vertical axis shows operation items (operation objects) and the horizontal axis shows time, and a time period required for each operation is represented in Gantt chart form, such as 802 and 803, based on the operation starting/ending date information.

Figure 9:
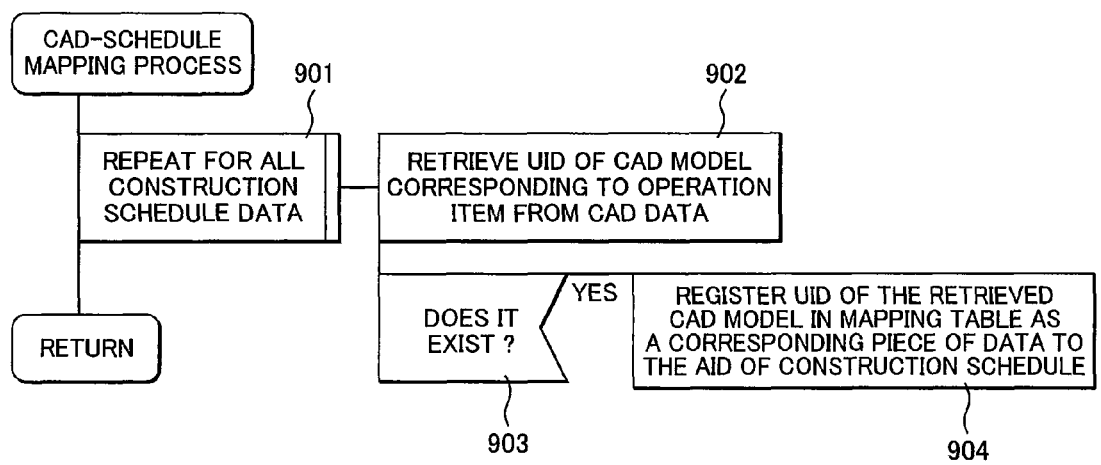
FIG. 9 is an explanatory drawing showing an overview of a CAD-schedule mapping process.

FIG. 9 shows a process for generating information of a CAD-schedule map, which associates a CAD model with an operation, based on the information in the CAD model storage unit 101 and the construction schedule storage unit 102.

A CAD-schedule mapping process shown in FIG. 9 will be described below. First of all, the following processes are repeated for each operation item in the construction schedule table 701 (Step 901). Based on the information stored in the operation item field of the construction schedule table 701, the UID of the corresponding CAD model is retrieved from CAD data in the installation object table 201 (Step 902). If the CAD model exists (Step 903), the UID of the retrieved CAD model is registered in the CAD-schedule map table storage unit 104 as a corresponding piece of data to the AID of the processing construction schedule data (Step 904).

A specific example of the content of the CAD-schedule map table storage unit 104 is shown in FIG. 11. In a CAD-schedule map table 1101, each record contains a pair of an UID for identifying the CAD data and an AID for identifying the construction schedule data.

According to the construction progress visualization system in the present embodiment, the overall material amount and the construction progress of a temporary structure such as scaffolding can be grasped in a 3D space based on a CAD model of the construction object and the construction schedule.

Figure 10:
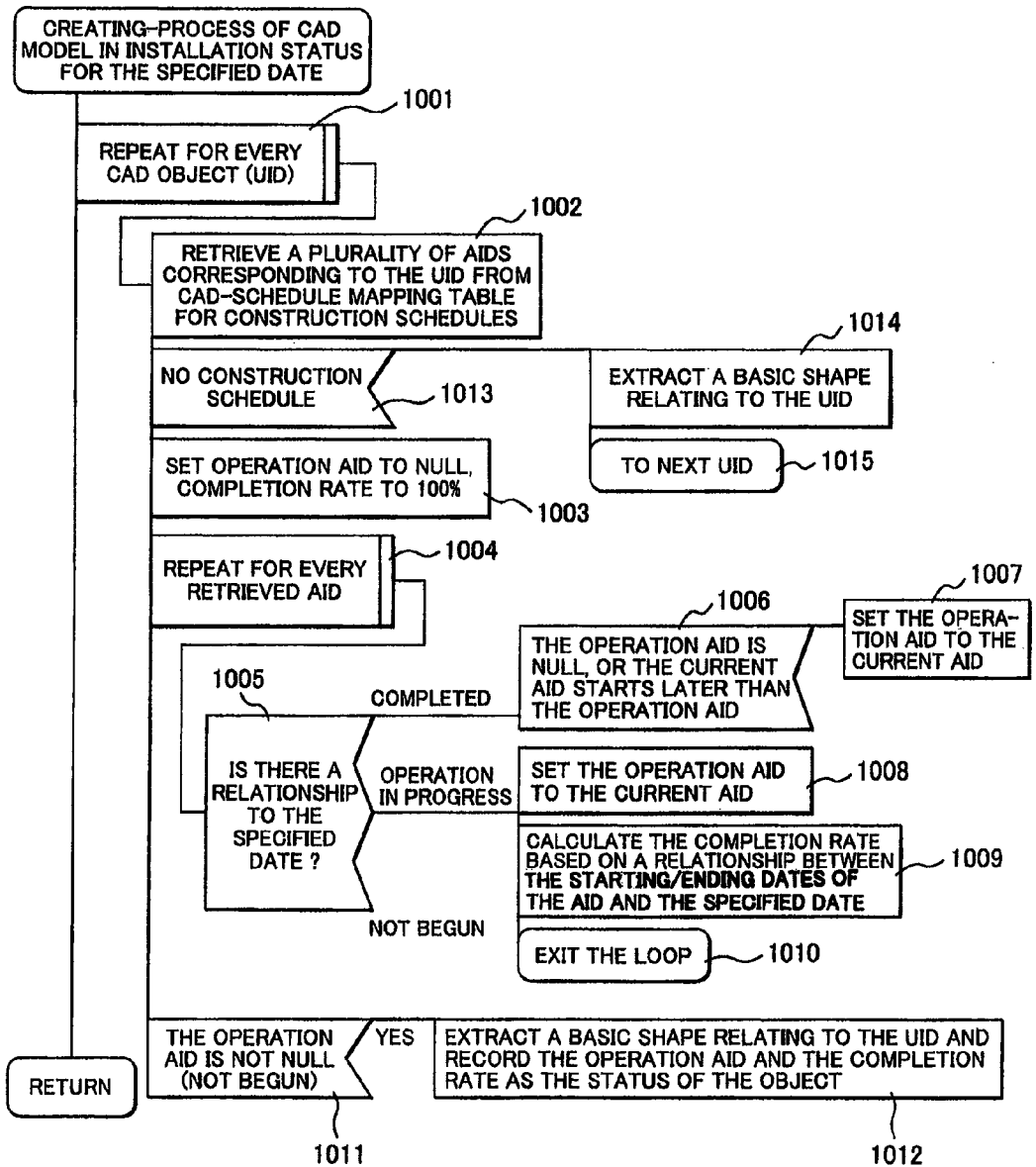
FIG. 10 is a flowchart showing an overview of a process being carried out by a display CAD model creating unit shown in FIG. 1.

Next, the process carried out in the display CAD model creating unit 106 shown in FIG. 1 is described in detail with reference to FIG. 10. In this process, a CAD model for a specified date is created by using information in the CAD model storage unit 101, the construction schedule storage unit 102, and the CAD-schedule map table storage unit 104, and by extracting, from CAD models, the installation status of the construction object on the specified date stored in the simulation display date storage unit 105.

The following processes are repeated for each CAD model (Step 1001). The identifier for the processing-object CAD model is its UID.

In these repeated processes, first, a plurality of AIDs of the construction schedule data, relating to the processing UID, is retrieved from the data in the CAD-schedule map table 1101

(Step 1002). If no construction schedule data exists (Step 1013), the CAD model is considered as a static construction, and a basic shape corresponding to the UID is extracted from the graphic shape element table 301 (see FIG. 3) and stored in the display CAD model storage unit 107 (Step 1014). Then, the following processes are skipped to move on to the next UID in the loop process (Step 1015).

Next, an operation AID, and a completion rate of the operation are provided as operation parameters; the operation AID is set to NULL and the completion rate to 100% (Step 1003), and the following is repeated for each AID retrieved in the step 1002 (Step 1004).

A relationship between the construction schedule data corresponding to the AID and the specified date is checked (Step 1005). As a result, when the operation for the processing AID has already been completed (in other words, the specified date is later than the operation ending date) and in addition, when the operation AID is NULL or the operation of the currently processing AID starts later than the operation of the operation AID (Step 1006), the value of the currently processing AID is substituted into the operation AID (Step 1007). If the relationship between the currently processing AID and the specified date shows "the operation is in progress" (the specified date is in between the starting and the ending dates of the operation of the processing AID), the currently processing AID is substituted into the work AID (Step 1008), and the completion rate is calculated by using the relationship between the starting/ending dates of the processing AID and the specified date. The completion rate can be calculated by dividing the number of days from the starting date to the specified date by the number of days from the starting date to the ending date (Step 1009). Then, the loop for processing the AID is ended (Step 1010).

After all the AIDs have been processed, the value of the operation AID is checked, and when the value is not NULL, that is, when the construction operation has been started (Step 1011), the basic form associated with the processing UID is extracted from the graphic shape element table 301 and stored in the display CAD model storage unit 107. The display CAD model storage unit 107 contains a display graphic shape element table 1102 as shown in FIG. 12. The display graphic shape element table 1102 has fields of operation name and completion rate for each graphic shape element. In the step 1012, the value of the operation AID is stored in the operation name field and the completion rate data obtained in the previous process is stored in the completion rate field.

Figures 13, 14:
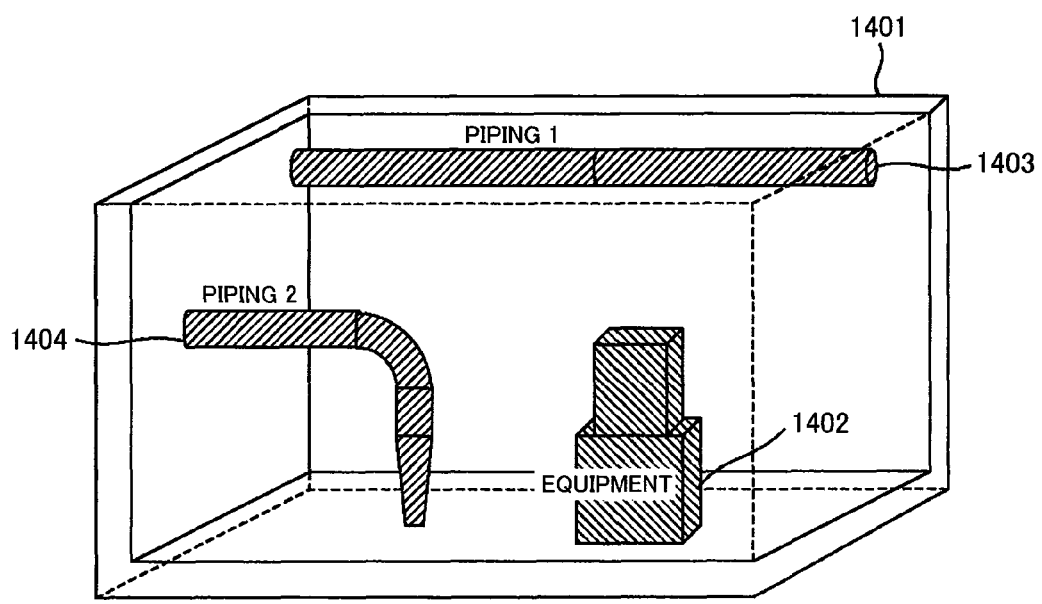
FIG. 13 is an explanatory drawing showing an example of an operation display color table.
FIG. 14 is an explanatory drawing showing an example of construction CAD models.
Figure 15A:
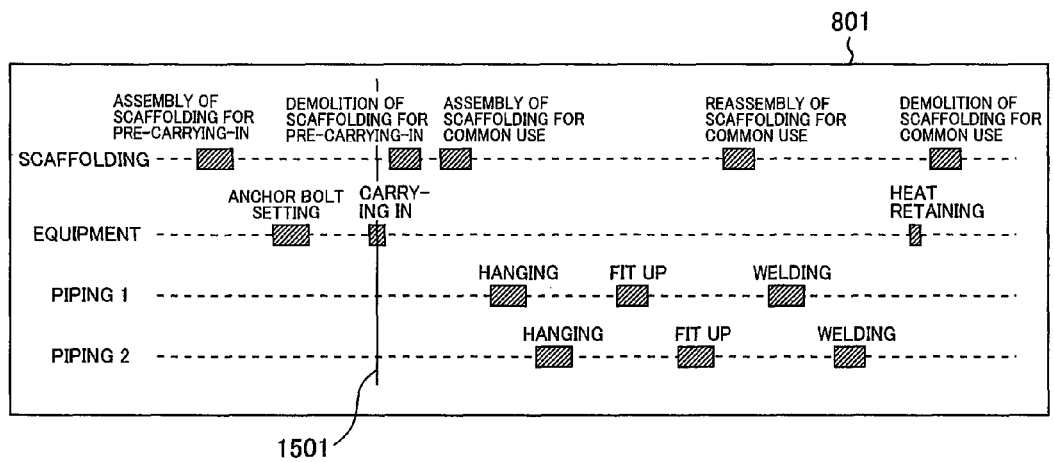
FIG. 15A is an explanatory drawing showing an example of specifying a display date in a construction schedule and an example of displaying a status on that day.
Figure 15B:
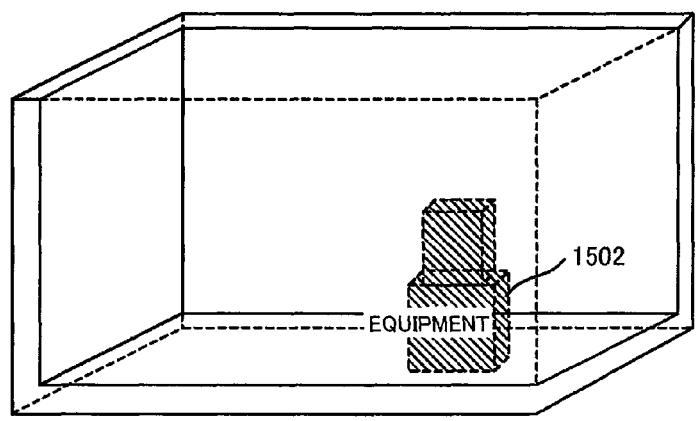
FIG. 15B is an explanatory drawing showing an example of displaying a status of an equipment on a display day shown in FIG. 15A.

As a result of the above processes, when the CAD models as shown in the example of FIG. 14 and the schedule shown in FIG. 15A are assumed, and when a date shown as 1501 is specified as the specified display date, the information as shown in FIG. 12 can be obtained. In FIG. 14, a building frame 1401, piping 1 (1403), piping 2 (1404), and equipment 1402 are registered as CAD models. The installation object table looks like the installation object table 201 (see FIG. 2). The construction schedule table contains information as in the construction schedule table 701 (see FIG. 7). Since the specified date 1501 indicates the midpoint of equipment carrying-in, two cubes making up the equipment and a plurality of cubes representing the building frame are registered in the display graphic shape element table 1102 by the display CAD model creating unit 106. For the cubes making up the equipment, the operation name showing the carrying-in operation and a completion rate of 50% at that time are stored. A display example processed in this condition is shown in FIG. 15B. Since the building frame is a static model, its form is displayed as is, but the form of the equipment is displayed as semitransparent showing the completion rate of 50% in the color showing the status of being carried in. The display color corresponding to each operation is stored in the operation display color table storage unit 116, which stores operation display colors corresponding to operation statuses, and the display color is specified in an operation display color table 1103, as shown in FIG. 13. In this example, the color for carrying-in is specified as blue.

In the above processes, a CAD model whose operation has not begun at the time of scaffolding demolition can be excluded from the objects of scaffolding creation, and it is possible to evaluate construction by taking into consideration a case of scaffolding reassembly during the construction, such as the case of changing the scaffolding from the scaffolding for carrying-in to the scaffolding for common use.

A method for displaying scaffolding is explained next.

When a construction operation is performed, scaffolding must be assembled around a construction object to obtain workability of the construction operation. Generally, the size and height of scaffolding are standardized. The purpose of the construction progress visualization system in the present embodiment is to obtain the overall scaffolding area based on this size to show the overview of the scaffolding conforming to the construction schedule, and to display the progress.

Figure 16A:
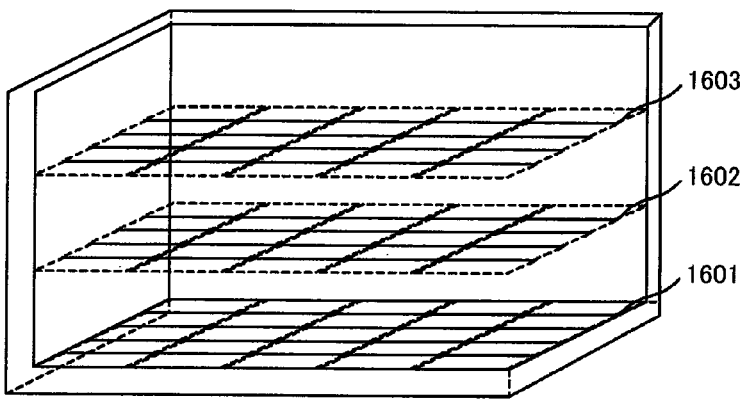
FIG. 16A is an explanatory drawing showing an example of displaying layers of virtual scaffolding.
Figure 16B:
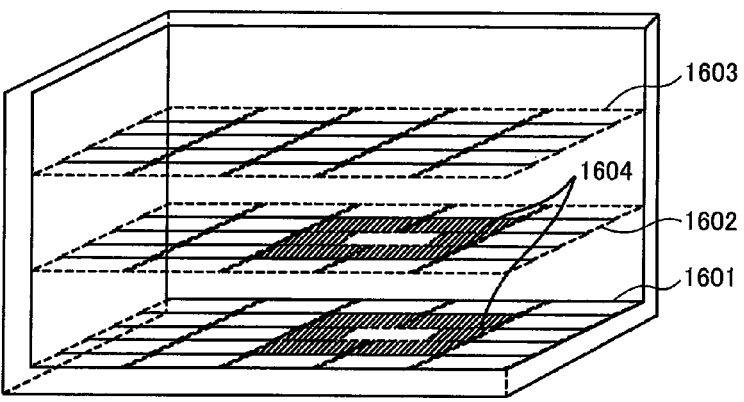
FIG. 16B is an explanatory drawing showing an example of displaying virtual scaffolding disposed around a position in which an equipment is disposed.
Figure 16C:
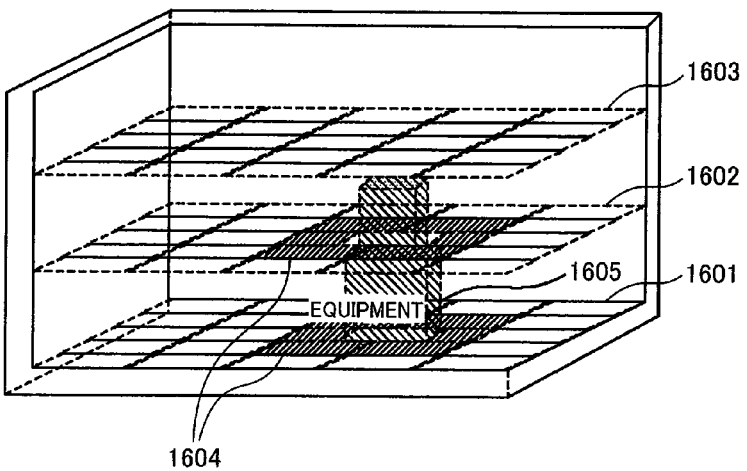
FIG. 16C is an explanatory drawing showing an example of displaying an equipment and virtual scaffolding disposed around the equipment.

FIG. 16 (16A, 16B, and 16C) shows an overview of a process for obtaining scaffolding. First, a construction area is divided in the height direction based on the standard height of scaffolding to create scaffolding layers 1601, 1602, and 1603. Then, each of the layers 1601, 1602, and 1603 is divided into a mesh of cells based on the standard size (width and length) of the scaffolding. When equipment 1605 is to be carried in, scaffolding for carrying-in of the equipment 1605 must be assembled around a carrying-in position of the equipment before carrying-in. In FIGS. 16B and 16C, 1604 is the scaffolding for carrying-in. In order to obtain this, the equipment to be installed is compared to the position of mesh cells on each layer, and the mesh cells around the carrying-in position of the equipment (within an operation range) are extracted. The mesh cells for the scaffolding location are selected in this way. As described above, in order to obtain a scaffolding area, the installation status of the equipment on the date to be displayed is not considered, but rather, the installation of the equipment is assumed to be completed as well as the scaffolding to not be changed during the construction operation. These processes for obtaining a scaffolding area (a virtual scaffolding area) are executed by the scaffolding schedule extracting unit 108, the scaffolding-demolition CAD model creating unit 110, and the virtual scaffolding creating unit 112 shown in FIG. 1.

The scaffolding schedule extracting unit 108 extracts a scaffolding schedule containing the specified display date from the construction operation schedules registered in the construction schedule table 701 in the construction schedule storage unit 102. In the example shown in FIG. 7, when the specified display date is 1501 shown in FIG. 15A, AID1 (assembly of scaffolding for pre-carrying-in) and AID2 (demolition of scaffolding for pre-carrying-in) are extracted. The schedule data are stored in the scaffolding schedule storage 109.

The scaffolding-demolition CAD model creating unit 110 searches the starting date of the scaffolding demolition stored in the scaffolding schedule storage unit 109, creates a CAD model for the installation status on the searched demolition starting date. The scaffolding-demolition CAD model creating unit 110 stores the created CAD model in the scaffolding-demolition CAD model storage unit 111. The extraction of the CAD model for the starting date of the scaffolding demolition can be achieved by the same algorithm as in the process 1006 shown in FIG. 10. At this time, the specified date is set to the demolition starting date. The result obtained would be the same as the one in the display graphic shape element table 1102, but it is stored in the scaffolding-demolition CAD model storage unit 111.

Figure 21:
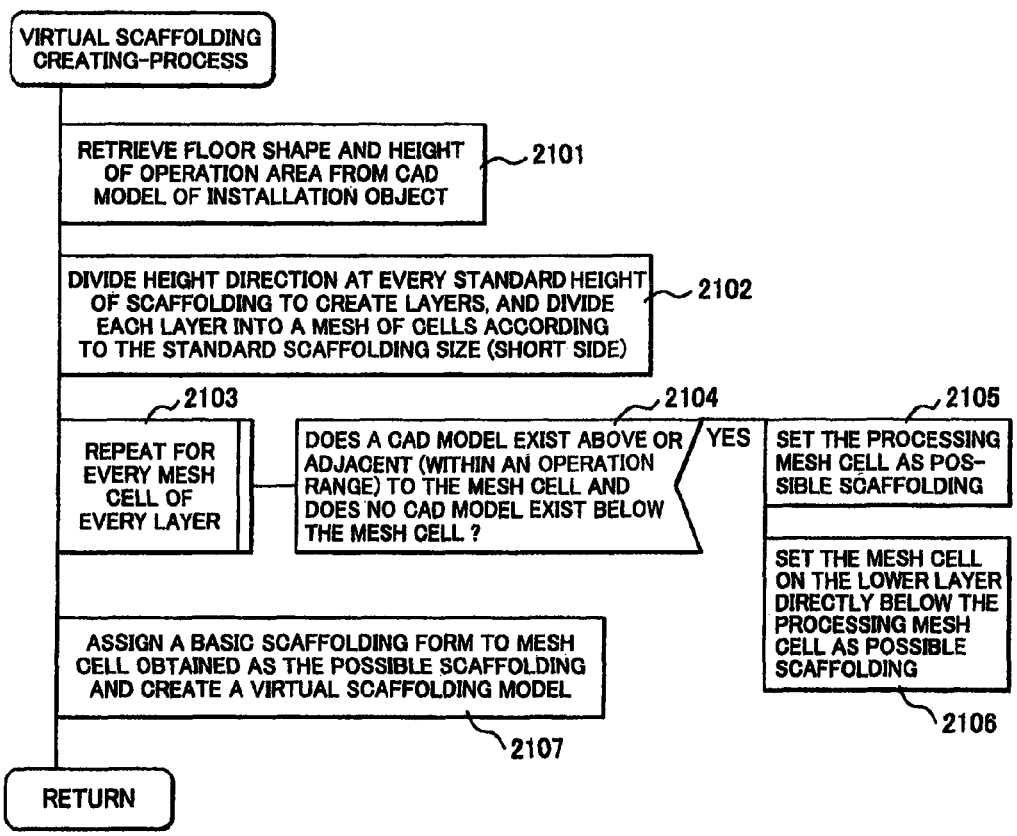
FIG. 21 is a flowchart showing an overview of a process being carried out by a virtual scaffolding creating unit shown in FIG. 1.

Next, the virtual scaffolding creating unit 112 retrieves a scaffolding area from the data in the scaffolding-demolition CAD model storage unit 111. The detailed flow is shown in FIG. 21. First, the floor shape and the height of the operation area are retrieved from the CAD model of the installation object (in this case, the CAD models stored in the scaffolding-demolition CAD model storage unit 111) (Step 2101). In this case, the model of the building frame is extracted, and the floor shape and the height are retrieved from the data of its form. Next, the height direction is divided at the standard height of the scaffolding to create layers, and each layer is further divided into a mesh of cells according to the standard size of the scaffolding (Step 2102). Then, the following processes are repeated for every mesh cell on each layer (Step 2103).

Whether a CAD model exists above or adjacent (within an operation range) to the processing mesh cell and no CAD model exists below the mesh cell is determined (Step 2104). When the determination of the step 2104 is "Yes", the processing mesh cell is set as possible scaffolding (Step 2105). In addition, the mesh cell located on the lower layer directly below the processing mesh cell is also set as possible scaffolding (Step 2106). This allows the scaffolding to be assembled at the location for installation operation of the equipment and not above the equipment. Furthermore, the overall structure of the scaffolding can be created without placing the scaffolding in midair by itself.

A standard scaffolding form is assigned to each mesh cell obtained as possible scaffolding in the above process, to create a scaffolding form model (Step 2107).

Figure 20A:
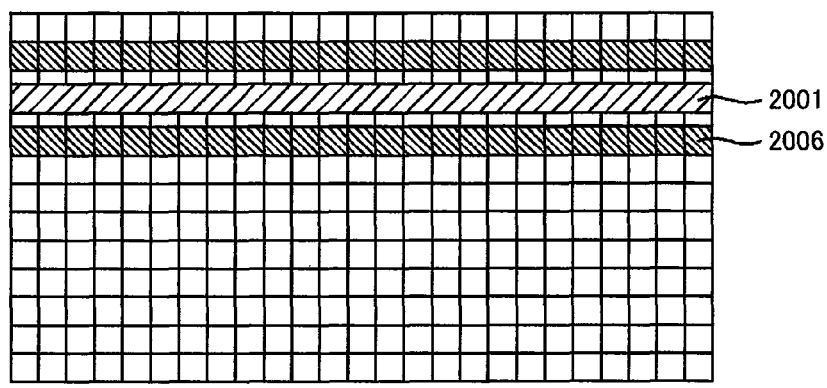
FIG. 20A is an explanatory drawing showing a process for obtaining a virtual scaffolding area in a top layer of a virtual scaffolding.
Figure 20B:
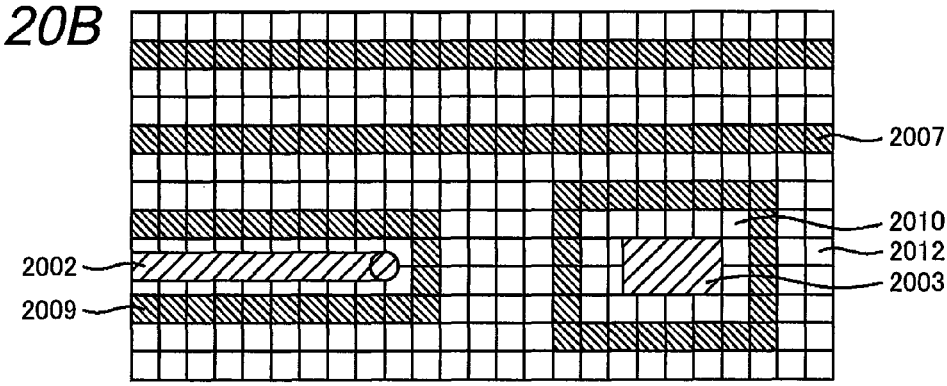
FIG. 20B is an explanatory drawing showing a process for obtaining a virtual scaffolding area in a second layer of a virtual scaffolding.
Figure 20C:
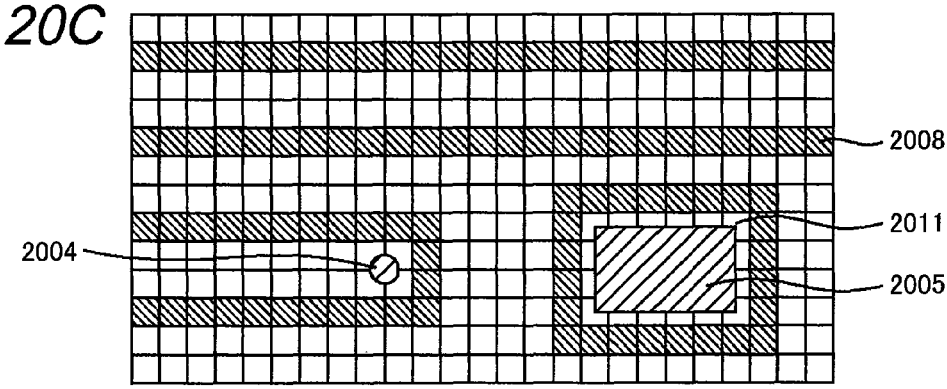
FIG. 20C is an explanatory drawing showing a process for obtaining a virtual scaffolding area in a bottom layer of a virtual scaffolding.

FIGS. 20A, 20B, and 20C show an example of possible scaffolding mesh cells in each layer (three layers in this example) for the CAD models shown in FIG. 14 assuming the time of the models' completion. FIG. 20A shows the top layer, in which a model 2001 corresponding to the piping 1 (1403) is selected and adjacent mesh cells 2006 are selected as possible scaffolding. At the same time, mesh cells 2007 (see FIG. 20B) and 2008 (see FIG. 20C) located below the mesh cells 2006 are also selected as possible scaffolding. FIG. 20B shows the second layer. In this layer, a model 2002 corresponding to the piping 2 (1404) and adjacent mesh cells 2009 are selected, and a model 2003 corresponding to the equipment 1402 and adjacent mesh cells 2012 are selected. Mesh cells 2010 are also adjacent to the equipment model 2003, however, since equipment model 2005 (see FIG. 20C) exists in mesh cells 2011 below them, the mesh cells 2010 are not possible scaffolding, and similarly for piping through hole 2004. FIG. 20C shows the bottom layer in the same manner.

Figure 18:
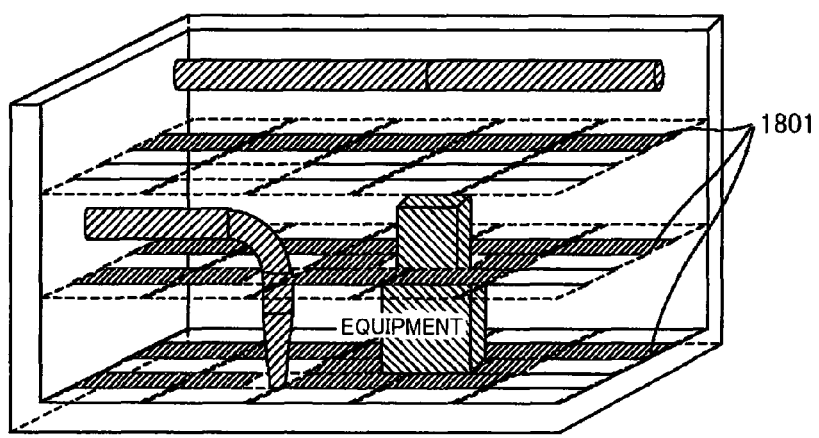
FIG. 18 is an explanatory drawing showing an example of CAD models and virtual scaffolding displayed concurrently.

As described above, an overall form of scaffolding areas 1801 as shown in FIG. 18 can be created. In FIGS. 18, 20A, 20B, and 20C, although the same models are used for explanation, the scales of the mesh cells are different due to illustration purposes.

Figure 22A:
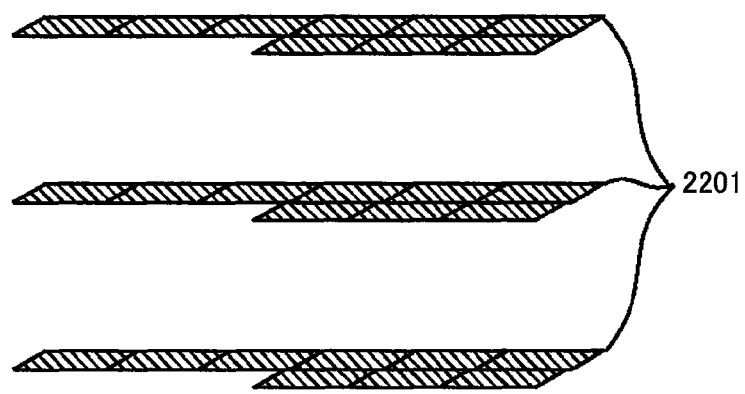
FIG. 22A is an explanatory drawing showing an example of a layout of virtual scaffolding.
Figure 22B:
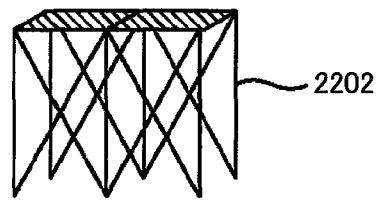
FIG. 22B is an explanatory drawing showing an example of a basic scaffolding form of a scaffolding.
Figure 22C:
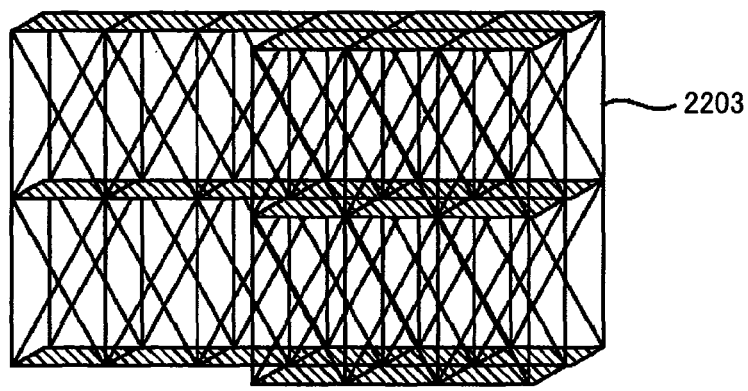
FIG. 22C is an explanatory drawing showing an example of a scaffolding form created based on a layout of virtual scaffolding shown in FIG. 22A and a basic scaffolding form shown in FIG. 22B.
Figure 23:
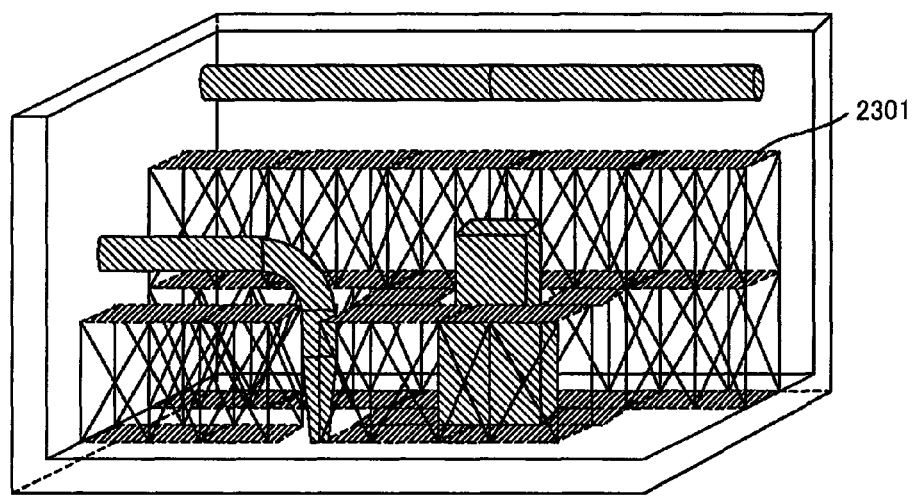
FIG. 23 is an explanatory drawing showing an example of CAD models and a scaffolding form displayed concurrently.

An example of creating a scaffolding form in the step 2107 of FIG. 21 is shown in FIGS. 22A, 22B, and 22C. In FIG. 22A, scaffolding mesh cells are used as scaffolding forms 2201 as is. On the other hand, a scaffolding form is generally standardized, which can be used to expand the form. For example, a basic scaffolding form 2202 as shown in FIG. 22B may be prepared, and when scaffolding areas such as those shown in FIG. 22A are given, the areas can be filled with the basic form to display the overall scaffolding structure. The example is shown in FIG. 22C as 2203. An example of a display using the basic scaffolding form in this way, corresponding to the overall form of scaffolding 1801 in FIG. 18 is shown in FIG. 23. In this figure, 2301 is the scaffolding form.

According to the construction progress visualization system of the present embodiment, it is possible to grasp the overall form of a scaffolding area in consideration of the scaffolding size.

A method for displaying the progress of a scaffolding installation operation of the present embodiment is described next.

Figure 19:
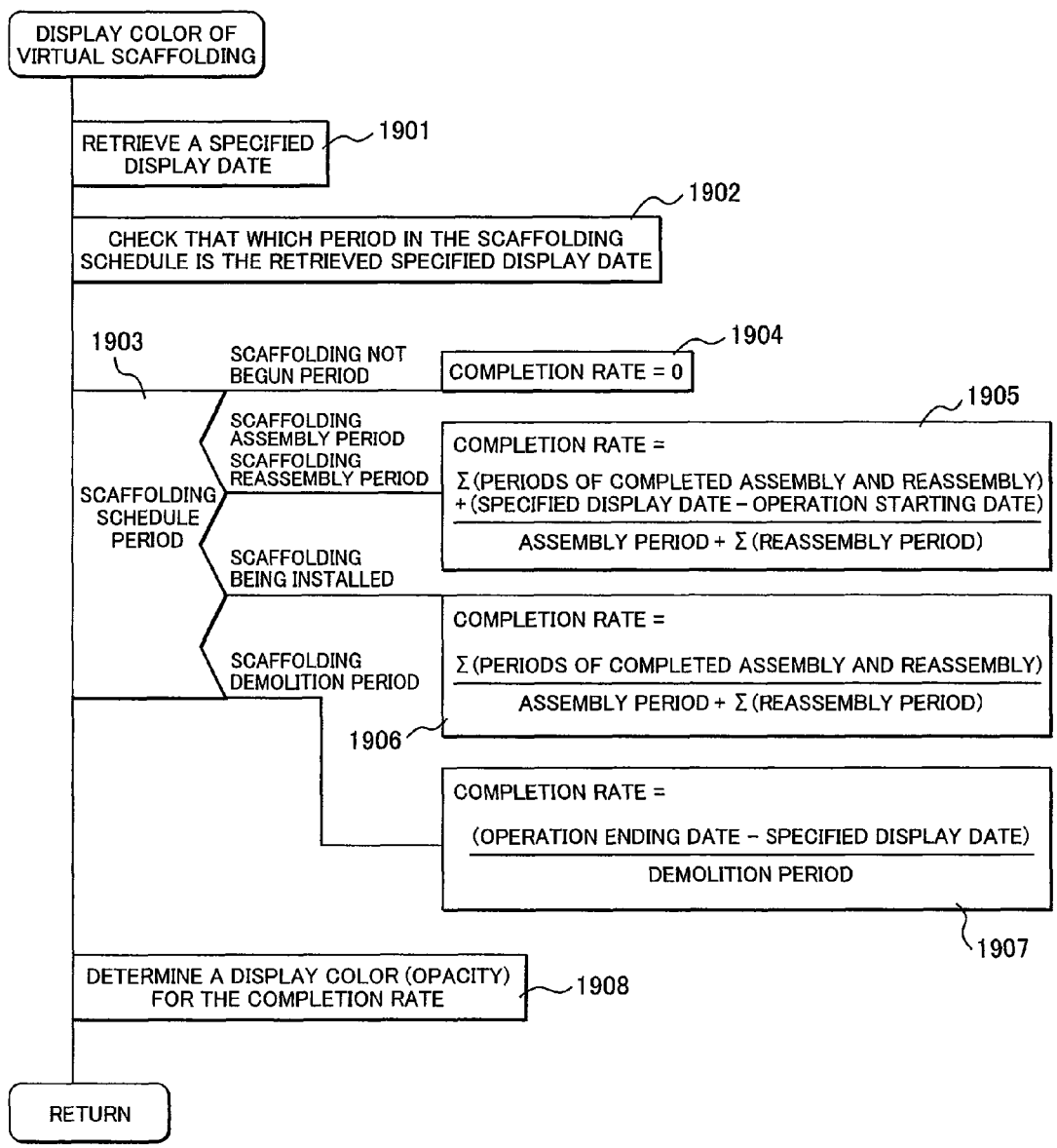
FIG. 19 is a flowchart showing an overview of a process being carried out by a scaffolding display color determining unit shown in FIG. 1.

The scaffolding here is not something that needs to be designed in detail or scheduled in detail for installation. For this reason, the purpose of the construction progress visualization system of the present embodiment can easily grasp the overall amount of operation for the scaffolding installation. In conventional construction progress visualization systems, an installation plan (schedule) of each individual construction element (equipment or piping) is defined by the operation starting date and the ending date; and according to this data, every element is displayed in its current status (in temporary layout, in welding operation, etc.) as the construction progresses. On the other hand, scaffolding does not change in status, nor is planned for every individual scaffolding unit. In addition, the scaffolding once installed may need to be removed for reassembly or be installed with additional scaffolding (reassembly operation) as the construction progresses, which makes it difficult to grasp the overview from a simple display of the completed form. Thus, in order to grasp the overall amount of installation operation of the scaffolding, the construction progress visualization system of the present embodiment displays the actual installation status of the scaffolding, and by varying the display form of the whole scaffolding, visualizes the overall amount of operation and progress of the scaffolding installation. This allows the amount of operation material and the progress relating to the scaffolding to be displayed in a comprehensible way. The amount of operation material of the scaffolding can be seen by creating the scaffolding form according to the method described above. The progress of the scaffolding operation can be obtained by the following method. This process is achieved by the scaffolding display color determining unit 114 shown in FIG. 1. Details of the process is shown in FIG. 19.

First of all, a specified display date is retrieved from the simulation display date storage unit 105 (Step 1901). Then, the retrieved specified display date is checked which period in the scaffolding schedule by using the date in the scaffolding schedule storage unit 109 (Step 1902). Each of the following processes is executed based on the scaffolding schedule period (Step 1903). If the scaffolding is not being installed yet, the scaffolding completion rate is set to 0% (Step 1904). If the scaffolding is being assembled or being reassembled, the completion rate is set to the value obtained by adding the number of days spent for the assembly of scaffolding already completed before the specified date and the number of days spent for the current operation, then dividing the total by the number of days required for the whole assembly (Step 1905). If the scaffolding has already been installed (the scaffolding has been installed and no scaffolding assembly operation is in progress), the completion rate is set to the value obtained by dividing the number of days spent for the assembly of the scaffolding already completed before that time by the number of days required for the whole assembly (Step 1906). If the scaffolding is being demolished, the completion rate is set to the value obtained by dividing the number of days from the specified date to the demolition ending date by the number of days of the whole demolition period (Step 1907).

In the above processes, when a plurality of scaffolding operations are scheduled in series with a demolition process in between, such as the installation of scaffolding for pre-carrying-in followed by the installation of scaffolding for common use, they are handled as having a separate completion rate. On the other hand, when the scaffolding is partially changed, such as the reassembling of scaffolding for common use, the operation is considered to be 100% completed when the series of reassembling operations are finished.

For a demolition period, the completion rate of the scaffolding is calculated for every operation day so that the rate is 100% on the starting date and 0% on the ending date of the demolition.

In visualization of normal construction operation (temporary layout, welding, etc.), an amount of operation is calculated as 0% at the beginning and 100% at the end of each operation schedule. However, the scaffolding operation must be estimated in consideration of relevancy among individual operation schedules (scaffolding installation, reassembly, and demolition operation). By the above processes, it is possible to intuitively grasp the progress of the whole scaffolding operation.

Next, a display form corresponding to the completion rate obtained by the above processes is determined, and the determined display form is stored in the scaffolding display color storage unit 115 (Step 1908). To be more specific, opacity of the display is determined according to the completion rate. This changes the display of the scaffolding form from transparent to semitransparent, and finally to nontransparent as the scaffolding operation progresses. The scaffolding display will be sequentially changed from nontransparent to transparent as the scaffolding is demolished. Therefore, it is possible to intuitively grasp the progress of the operation. Besides controlling the transparency, the scaffolding may be displayed by varying the color scale. In addition, different display colors may be used for the scaffolding for pre-carrying in and the scaffolding for common use to make the scaffolding status easier to see.

Figure 17:
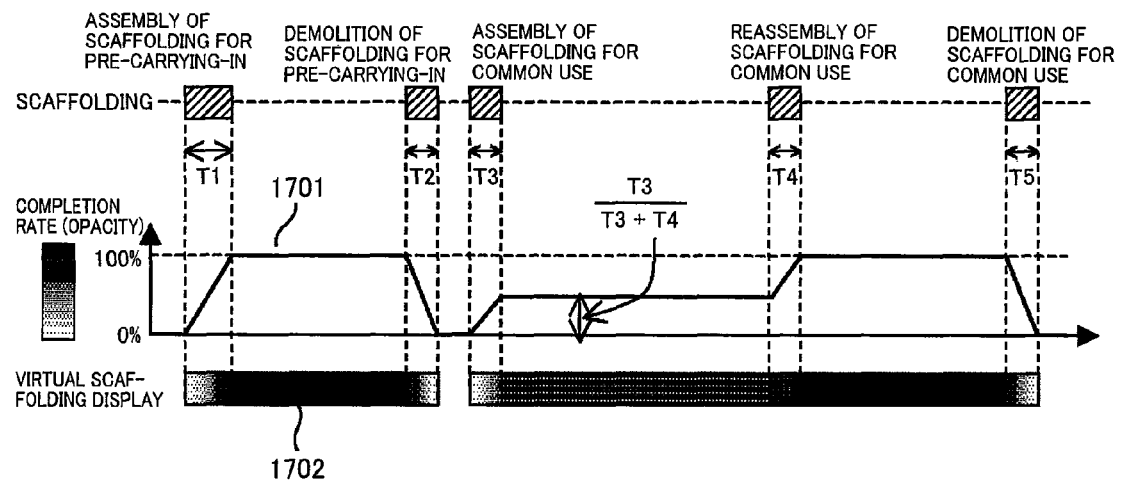
FIG. 17 is an explanatory drawing showing a relationship between a scaffolding schedule and completion rate of scaffolding.

A specific example of a completion rate display is shown in FIG. 17.

In this example, the scaffolding for pre-carrying-in is to be assembled during T1 days and demolished during T2 days. Then, for the construction operation, the scaffolding for common use is planned to be assembled during T3 days, reassembled during T4 days, and demolished during T5 days. A completion rate of the scaffolding operation in this case changes as 1701 (see FIG. 17). The completion rate is 0% when no scaffolding exists, and changes from 0% to 100% due to the assembly operation of the scaffolding for pre-carrying-in since this scaffolding does not include reassembly. The completion rate is kept at 100% during the period between its completion and demolition. The demolition of the scaffolding for pre-carrying-in changes the completion rate from 100% to 0% during T2 days. With regard to the scaffolding for common use, the completion rate changes from 0% to T3/(T3+T4) % during the assembly period. This is because the reassembly operation is yet to be done. Then, the completion rate is changed from T3/(T3+T4) % to 100% during the reassembly period T4 days, and is kept at 100% until its demolition. The completion rate changes from 100% to 0% during the demolition of T5 days.

Corresponding to such changes in the completion rate, the display of the scaffolding form is changed as 1702 (see FIG. 17). In this chart, white represents transparent, grey represents semitransparent, and black represents nontransparent.

Figure 24:
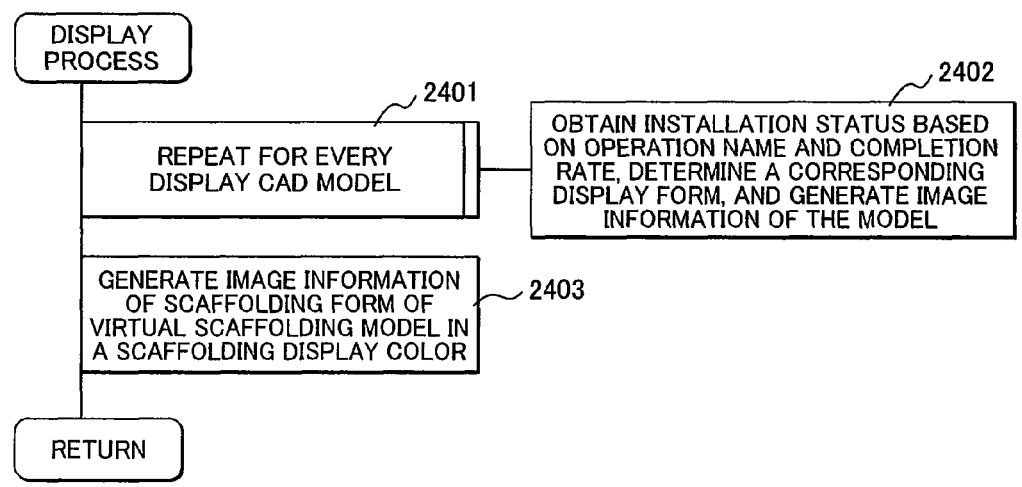
FIG. 24 is a flowchart showing an overview of a process being carried out by a display process unit shown in FIG. 1.

Finally, the display process unit 117 shown in FIG. 1 generates the image information including the CAD model of the installation object and the scaffolding form. Details of the process are shown in FIG. 24. First of all, the display graphic shape element table 1102 (FIG. 12) in the display CAD model storage unit 107 is referenced and the following is repeated for every display CAD model (Step 2401). The operation being done to the model at the time is checked from the operation name field of the display graphic shape element table 1102, and a display form corresponding to the operation name is obtained from the operation display color table 1103 (FIG. 13) in the operation display color table storage unit 116 which keeps operation display colors corresponding to installation statuses. The image information of the display CAD model having the obtained color is generated. At this time, it is also possible to create an intermediate color using the colors of the previous and the next operations, and generate image information of the display CAD the model having that color by using the information of the operation name and the operation completion rate (Step 2402).

Then, the image information of the scaffolding form of the virtual scaffolding model is generated by using information of the scaffolding form stored in the virtual scaffolding model storage unit 113 and information of the display color stored in the scaffolding display color storage unit 115 (Step 2403). The image information generated by the steps 2402 and 2403 is displayed on the display apparatus 118.

The above processes can obtain the overall form of the scaffolding to be displayed with respect to the CAD model of the construction object, and the completion rate of the scaffolding operation to be displayed according to the construction schedule, in a more comprehensive manner. In addition, the scaffolding assembly and amount of demolition operation can be reflected in the display. Thus, it is possible to oversee the progress of the whole work.

Embodiment 2

Next, a construction progress visualization system according to another embodiment of the present invention for a scaffolding display to reflect a status of construction operation is discussed.

Figure 25:
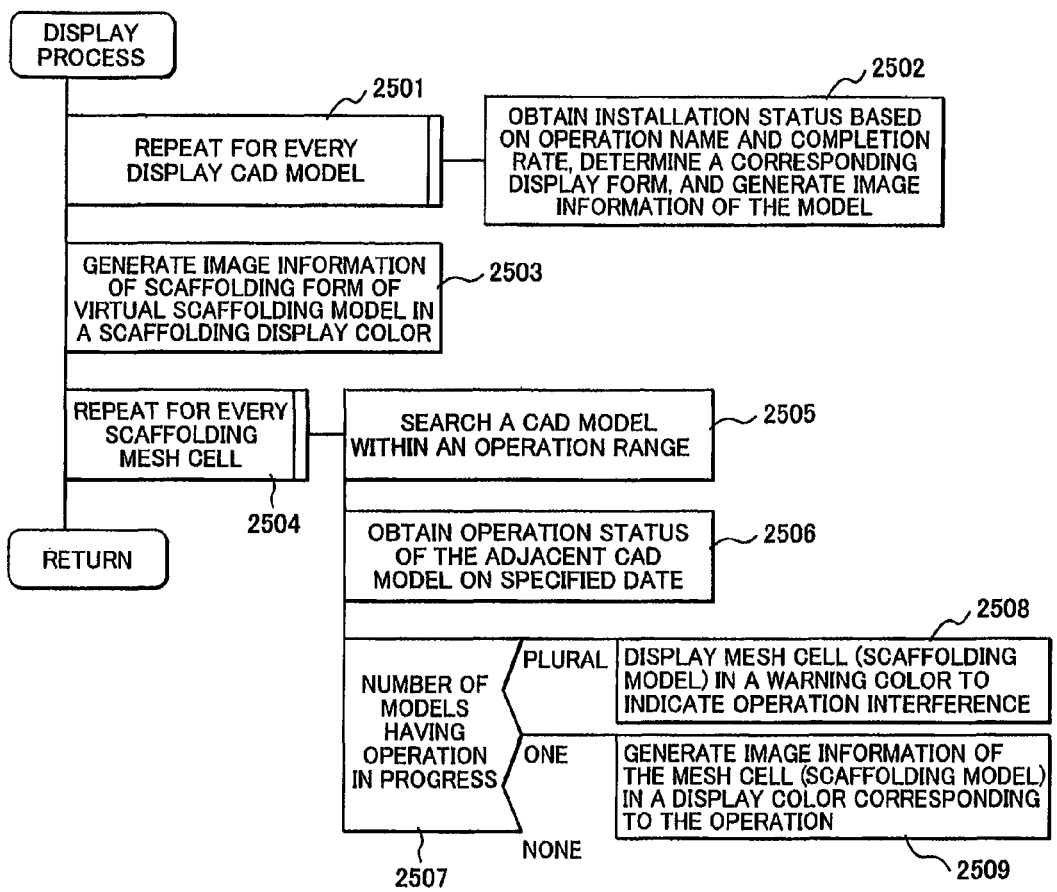
FIG. 25 is a flowchart showing an overview of a process being carried out by a display process unit in another embodiment.

The construction progress visualization system of the present embodiment has the same constitution as the embodiment shown in FIG. 1 except that the display process in the display process unit 117 is different in the present embodiment. Details of the process are shown in FIG. 25.

The steps 2501, 2502, and 2503 are the same as the steps 2401, 2402, and 2403 shown in FIG. 24 respectively. Then the following processes are repeated for every scaffolding mesh cell (Step 2504).

Whether there is a CAD model of a construction object within an operation range based on the mesh cell of a processing object or not is searched (Step 2505). For the searched CAD model within an operation range, the operation status on the specified display date is obtained (Step 2506). If no model of an operation in progress is found (Step 2507), the image information of the scaffolding mesh cell is not changed. When one model of an operation in progress is found, image information of the mesh cell or the scaffolding form model is generated in the display color corresponding to the operation of the CAD model (Step 2509). When a plurality of models of operation in progress are found, it means that these operations are in interference, thus, image information of a predetermined warning color or a warning symbol being arranged on the mesh cell is generated (Step 2508). The image information generated by the steps 2502, 2503, and 2508 is displayed on the display apparatus 118.

Figure 26A:
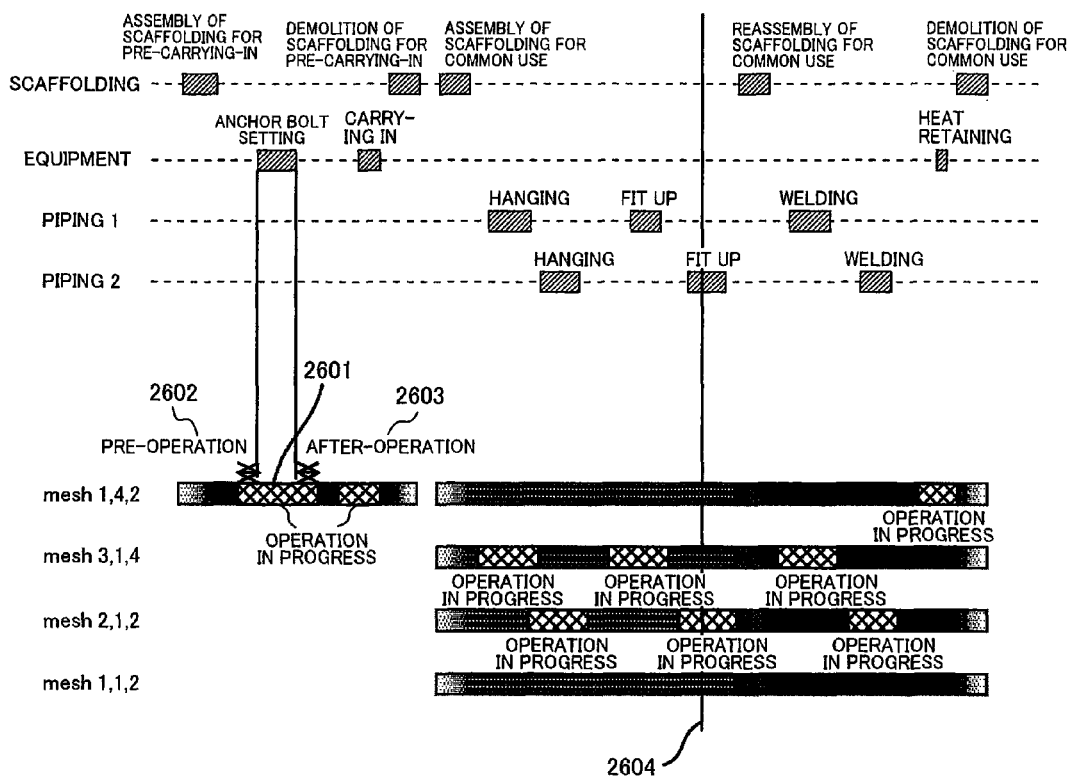
FIG. 26A is an explanatory drawing showing an example of an image information of a construction status in a construction schedule generated in another embodiment.
Figure 26B:
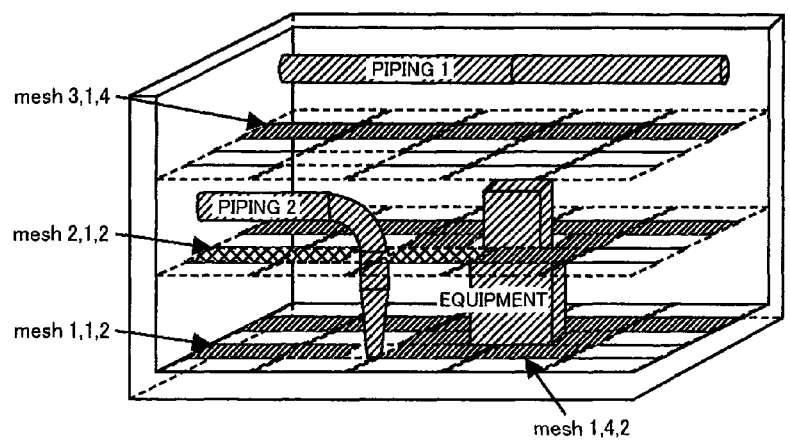
FIG. 26B is an example of image information an installation status of equipment on a display day shown in FIG. 26A in another embodiment.

Specific examples of the image information are shown in FIGS. 26A, 26B, and 27 (27A and 27B). The specific examples are displayed on the display apparatus.

The construction schedule shown in FIG. 26A is used for a construction status display. FIG. 26B is an example of the image information. The difference in the display colors of the three mesh locations (mesh 1,1,2, 1,4,2, 2,1,2, and 3,1,4) shown in FIG. 26B is shown in the lower part of FIG. 26A. Each of the mesh cells is displayed in the display color of the adjacent CAD model when the CAD model is in progress. When the specified display date is 2604, the image information looks like FIG. 26B. Since fit up operation is in progress for the piping 2, the display color of an adjacent mesh cell (mesh 2,1,2) is different. In this case, referring to the operation display color table 1103 shown in FIG. 13, the cell is displayed in magenta. It may be displayed simply in one operation color regardless of the operation type.

A period of displaying the operation-in-progress status may be matched with the actual operation schedule, or else, a pre-operation period and an after-operation period may be provided before and after each operation to display the operation period including those periods in a different display color. For example, a display period 2601 for the anchor bolt setting operation of the equipment in FIG. 26A can include a pre-operation period 2602 before the beginning of the anchor bolt setting and an after-operation period 2603 after its completion. As a consequence, it is possible to display the occupancy state of the operation area, which cannot be displayed in the schedule. The number of days for the pre-operation and the after-operation should be defined beforehand for each operation. The number of days may also be changed according to the amount of operation material.

FIG. 27 shows an image information example of operations in interference.

Figure 27A:
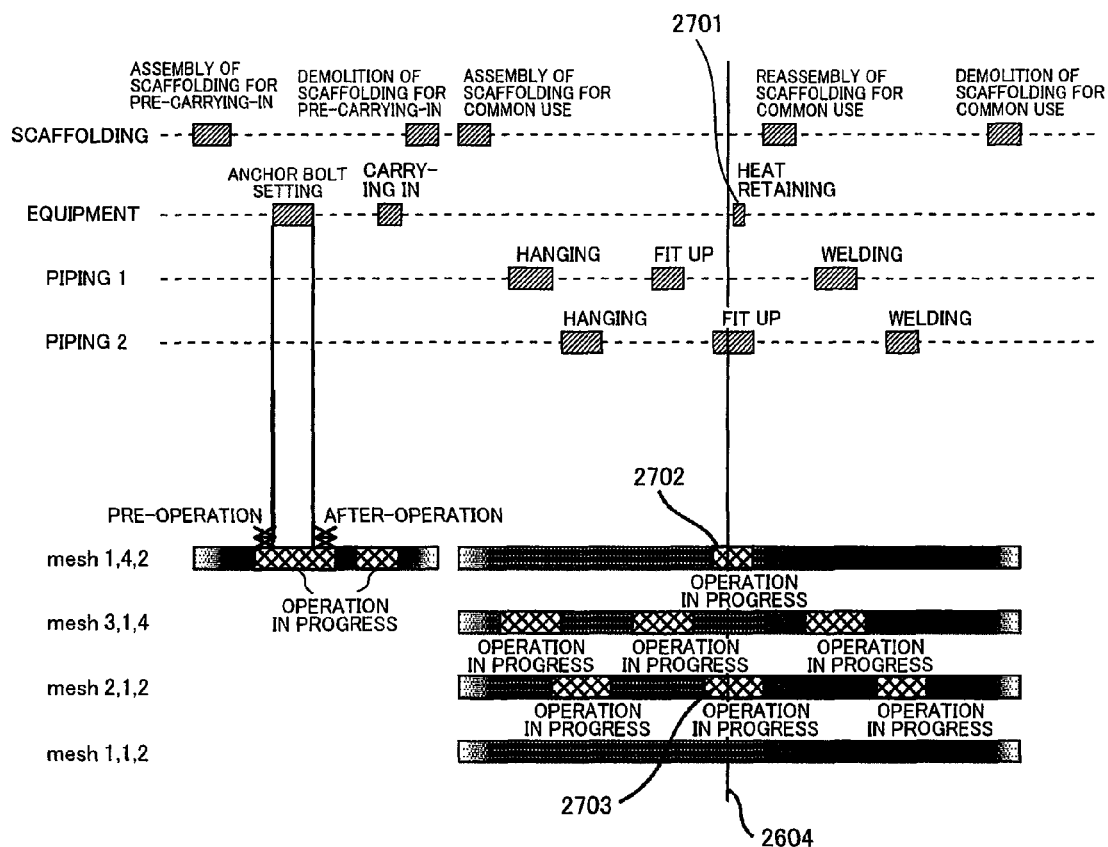
FIG. 27A is an explanatory drawing showing another example of image information of a construction status in a construction schedule in another embodiment.
Figure 27B:
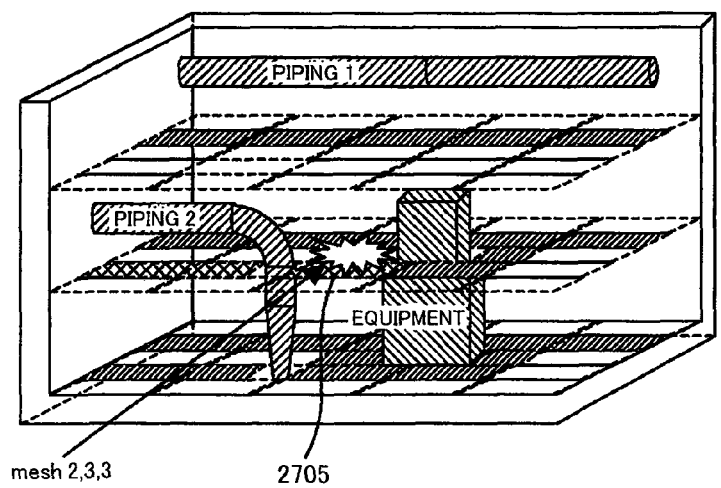
FIG. 27B is an explanatory drawing showing an example of warning image information on a display day shown in FIG. 27A in another embodiment.

This example displays the construction schedule shown in FIG. 27A on the specified display date 2604. In this example, an operation period 2702 for heat retaining operation 2701 of the equipment and an operation period 2703 for fit up operation of the piping 2 are in interference at a scaffolding mesh cell (mesh 2,3,3). A symbol 2705 (FIG. 27B) showing the interference is displayed on the mesh cell to give a warning.

By the above processes, it is possible to check the status of operation progress to be displayed using a scaffolding model, and interference between operations. In particular, small operations are easily overlooked on a display when CAD models are just displayed in different colors. However, with the construction progress visualization system of the present embodiment, an operation status can be displayed using scaffolding, which prevents overlooking small operations and makes it possible to grasp the operation status.

Additionally, in the present embodiment, the construction progress visualization system may be made such that selecting the mesh cell or the symbol showing interference, using an input device such as a keyboard or a pointer, would indicate the CAD models involved in the interference. In this way, even when a plurality of CAD models exists, the operations in interference can be seen through the CAD models. For example, in FIGS. 27A and 27B, by selecting the scaffolding mesh cell (mesh 2,3,3) or the symbol 2705 showing the interference, the CAD model associated with the heat retaining operation 2701 of the equipment and the CAD model associated with the operation period 2703 of the piping 2 may be displayed in highlight. Depending on the setting, either CAD model involved in the interference may be displayed in highlight.

The above embodiments are for a computer system including a central processing unit (CPU), a memory, an auxiliary memory device, an input device such as a keyboard, and a display device such as a screen. Each processing step is stored in the memory as a program, and executed by the central processing unit. A specified display date, selections of display objects, parameters and so on are inputted by a user with the input device such as a keyboard, and the results are stored in the memory or the auxiliary memory device. Furthermore, the results are displayed in 3D image on the screen to the user.

Each processing system may be achieved in a network environment for executing the above embodiments.

In the construction progress visualization system according to the above embodiments, it is possible to oversee operation, even when a small operation is hidden by CAD models in display, from a display of adjacent scaffolding. In addition, when different construction operations are planned in the same place, interference of the operations can be warned of.

What is claimed is:

1. A construction progress visualization system, comprising:
   a computer aided design (CAD) model storage unit for storing a three-dimensional (3D) CAD model of a construction object;
   a construction schedule storage unit for storing construction schedule data;
   a scaffolding model creating-unit for creating an area and a form of scaffolding required for a construction operation based on the 3D CAD model and the construction schedule data;
   a scaffolding schedule extracting-unit for extracting scaffolding schedule data regarding the scaffolding from the construction schedule data in the construction schedule storage unit;
   a scaffolding display form determining-unit for determining a completion rate of the scaffolding on a visualization-target date based on a relationship between the visualization-target date and the scaffolding schedule data, and obtaining a display form of the scaffolding; and
   a display process unit for generating display information of the CAD model, and display information of the scaffolding area based on the obtained display form of the scaffolding,
   wherein the scaffolding model creating-unit has a first processing-unit for dividing a construction-object space in a height direction based on a scaffolding standard height to create a plurality of layers, and further dividing each of the layers into a plurality of mesh cells based on a scaffolding width,
   a second processing-unit for setting at least one of the mesh cells and at least one other mesh cell below the at least one of the mesh cells as the scaffolding areas when the CAD model exists above or adjacent to and no CAD model exists below each of the mesh cells, and
   a third processing-unit for creating a scaffolding model for the mesh cells determined as the scaffolding area.

2. The construction progress visualization system according to claim 1,
   wherein the scaffolding model creating-unit has a fourth processing-unit for setting a CAD model for a scaffolding demolition starting date in a scaffolding schedule containing a visualization-object date as the CAD model referred to for creating the scaffolding model.

3. The construction progress visualization system according to claim 1:
wherein the scaffolding display form determining-unit calculates the scaffolding completion rate by a first calculation that for a day before scaffolding demolition, a total number of assembly operation days is calculated based on a number of scaffolding assembly days and a number of scaffolding reassembly days, and a ratio of a number of operation days completed by a visualization-target date to the total number of the assembly operation days is calculated as the completion rate; and a second calculation that for a day between a start and an end of the scaffolding demolition, a number of demolition operation days is used as a total number of operation days, which total is set to 100%, and a ratio of the number of demolition operation days remaining after the visualization-target date is calculated as the completion rate.

4. The construction progress visualization system according to claim 1:
wherein the display process unit has
a fifth processing-unit for searching, for each of the mesh cells of the scaffolding area, the CAD model existing above and adjacent to the mesh cell;
a sixth processing-unit for checking an operation status of the searched CAD model on a specified display date;
a seventh processing-unit for generating display information indicating each of the mesh cells as an operation-in-progress mesh cell when the operation for the CAD model is in progress; and
an eighth processing-unit for generating display information indicating operation interference on a given mesh cell when a plurality of CAD models having an operation-in-progress are found in the search.

5. The construction progress visualization system according to claim 2:
wherein the scaffolding display form determining-unit calculates the scaffolding completion rate by a first calculation that for a day before scaffolding demolition, a total number of assembly operation days is calculated based on a number of scaffolding assembly days and a number of scaffolding reassembly days, and a ratio of a number of operation days completed by a visualization-target date to the total number of the assembly operation days is calculated as the completion rate; and a second calculation that for a day between a start and an end of the scaffolding demolition, a number of demolition operation days is used as a total number of operation days, which total is set to 100%, and a ratio of the number of demolition operation days remaining after the visualization-target date is calculated as the completion rate.

6. The construction progress visualization system according to claim 2,
wherein the display process unit has
a fifth processing-unit for searching, for each of the mesh cells of the scaffolding area, the CAD model existing above and adjacent to the mesh cell;
a sixth processing-unit for checking an operation status of the searched CAD model on a specified display date;
a seventh processing-unit for generating display information indicating each of the mesh cells as an operation-in-progress mesh cell when the operation for the CAD model is in progress; and
an eighth processing-unit for generating display information indicating operation interference on a given mesh cell when a plurality of CAD models having an operation-in-progress are found in the search.

7. A method of visualizing construction progress, comprising the steps of:
creating, by a computer, an area and a form of scaffolding required for a construction operation based on a three-dimensional (3D) computer aided design (CAD) model and construction schedule data;
extracting, by the computer, scaffolding schedule data regarding the scaffolding from the construction schedule data;
determining, by the computer, a completion rate of the scaffolding on a visualization-target date based on a relationship between the visualization-target date and the scaffolding schedule data, and obtaining a display form of the scaffolding; and
generating, by the computer, display information of the 3D CAD model, and display information of the scaffolding area based on the obtained display form of the scaffolding,
wherein the creation of the area and the form of the scaffolding are executed by dividing a construction-object space in a height direction based on a scaffolding standard height to create a plurality of layers, and further dividing each of the layers into a plurality of mesh cells based on a scaffolding width;
setting, by the computer, at least one of the mesh cells and at least one other mesh cell below the at least one of the mesh cells as the scaffolding areas when the CAD model exists above or adjacent to and no CAD model exists below each of the mesh cells; and
creating, by the computer, a scaffolding model for the mesh cells determined as the scaffolding area.

8. The method of visualizing construction progress according to claim 7,
wherein a CAD model for a scaffolding demolition starting date in a scaffolding schedule containing a visualization-object date is used as the CAD model referred to for creating the scaffolding model.

9. The method of visualizing construction progress according to claim 7,
wherein the calculation of the scaffolding completion rate includes
a first calculation that for a day before scaffolding demolition, a total number of assembly operation days is calculated based on a number of scaffolding assembly days and a number of scaffolding reassembly days, and a ratio of a number of operation days completed by a visualization-target date to the total number of the assembly operation days is calculated as the completion rate; and
a second calculation that for a day between a start and an end of the scaffolding demolition, a number of demolition operation days is used as a total number of operation days, which total is set to 100%, and a ratio of the number of demolition operation days remaining after the visualization-target date is calculated as the completion rate.

10. The method of visualizing construction progress according to claim 7,
wherein the display of the scaffolding area executes by
searching, for each of the mesh cells of the scaffolding areas, the CAD model existing above and adjacent to the mesh cell;
checking an operation status of the searched CAD model on a specified display date;

generating display information indicating each of the mesh cells as an operation-in-progress mesh cell when the operation for the CAD model is in progress; and generating display information indicating operation interference on a given mesh cell when a plurality of CAD models having an operation-in-progress is found in the search.

11. The method of visualizing construction progress according to claim 7, wherein the display information of the scaffolding area is displayed concurrently with the display information of the CAD model on a display apparatus.

12. The method of visualizing construction progress according to claim 8,
wherein the calculation of the scaffolding completion rate includes
a first calculation that for a day before scaffolding demolition, a total number of assembly operation days is calculated based on a number of scaffolding assembly days and a number of scaffolding reassembly days, and a ratio of a number of operation days completed by a visualization-target date to the total number of the assembly operation days is calculated as the completion rate; and
a second calculation that for a day between a start and an end of the scaffolding demolition, a number of demolition operation days is used as a total number of operation days, which total is set to 100%, and a ratio of the number of demolition operation days remaining after the visualization-target date is calculated as the completion rate.

13. A method of visualizing construction progress the method comprising steps of:
creating, on a computer having a first database storing a plurality of layers into which a construction-object space is divided in a height direction based on a standard scaffolding height, and a plurality of mesh cells into which the layers are divided based on a scaffolding width; and a second database storing a three-dimensional (3D) computer aided design (CAD) model corresponding to each of the mesh cells, an area and a form of scaffolding required for a construction operation based on a three-dimensional (3D) computer aided design (CAD) model and construction schedule data;
extracting, by the computer, scaffolding schedule data regarding the scaffolding from the construction schedule data;
determining, by the computer, a completion rate of the scaffolding on a visualization-target date based on a relationship between the visualization-target date and the scaffolding schedule data, and obtaining a display form of the scaffolding;
generating, by the computer, display information of the 3D CAD model, and display information of the scaffolding area based on the obtained display form of the scaffolding;

setting, by the computer, at least one of the mesh cells and at least one other mesh cell below the at least one of the mesh cells as the scaffolding areas when the 3D CAD model exists above or adjacent to and no CAD model exists below each of the mesh cells;
searching, by the computer, for each of the mesh cells of the scaffolding area, the CAD model existing above and adjacent to the mesh cell;
checking, by the computer, an operation status of the searched CAD model on a specified display date;
generating, by the computer, display information indicating each of the mesh cells as an operation-in-progress mesh cell when the operation for the CAD model is in progress;
displaying, by the computer, the plurality of mesh cells and highlighting one or more of the mesh cells having operation interference when a plurality of CAD models have an operation-in-progress on a corresponding one of the mesh cells, and when the highlighted mesh cell is selected, further displaying the 3D CAD model and highlighting associated with the selected mesh cell.

14. The method of visualizing construction progress according to claim 13, further comprising the step of:
calculating, by the scaffolding display form determining-unit, the scaffolding completion rate by a first calculation that for a day before scaffolding demolition, a total number of assembly operation days is calculated based on a number of scaffolding assembly days and a number of scaffolding reassembly days, and a ratio of a number of operation days completed by a visualization-target date to the total number of the assembly operation days is calculated as the completion rate; and a second calculation that for a day between a start and an end of the scaffolding demolition, a number of demolition operation days is used as a total number of operation days, which total is set to 100%, and a ratio of the number of demolition operation days remaining after the visualization-target date is calculated as the completion rate.

15. The A method of visualizing construction progress according to claim 13, further comprising the steps of:
searching, for each of the mesh cells of the scaffolding area, the CAD model existing above and adjacent to the mesh cell;
checking a operation status of the searched CAD model on a specified display date;
generating display information indicating each of the mesh cells as an operation-in-progress mesh cell when the operation for the CAD model is in progress; and
generating display information indicating operation interference on a given mesh cell when a plurality of CAD models having an operation-in-progress are found in the search.

* * * * *